(12) United States Patent
Tsuda

(10) Patent No.: US 9,264,016 B2
(45) Date of Patent: Feb. 16, 2016

(54) PIEZOELECTRIC COMPONENT HAVING A COVER LAYER INCLUDING RESIN THAT CONTAINS TRANSLUCENT FILLER

(71) Applicant: NIHON DEMPA KOGYO CO., LTD., Tokyo (JP)

(72) Inventor: Toshimasa Tsuda, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 145 days.

(21) Appl. No.: 14/079,640

(22) Filed: Nov. 14, 2013

(65) Prior Publication Data

US 2014/0132368 A1    May 15, 2014

(30) Foreign Application Priority Data

Nov. 15, 2012  (JP) ................................. 2012-250824
Dec. 18, 2012  (JP) ................................. 2012-275354

(51) Int. Cl.
  *H03H 9/10*  (2006.01)
  *H03H 3/08*  (2006.01)
  *H03H 9/05*  (2006.01)

(52) U.S. Cl.
  CPC ............. *H03H 9/1071* (2013.01); *H03H 3/08* (2013.01); *H03H 9/059* (2013.01)

(58) Field of Classification Search
  CPC ... H03H 9/059; H03H 9/1085; H03H 9/1092; H03H 9/64; H03H 9/725; H03H 9/1071; H03H 3/08
  USPC .............. 333/133, 193, 195; 310/313 B, 340, 310/342, 344, 348, 349
  See application file for complete search history.

(56) References Cited

U.S. PATENT DOCUMENTS

| 5,920,142 | A  | * | 7/1999  | Onishi et al. .............. 310/313 R |
| 8,264,128 | B2 | * | 9/2012  | Tsuda .......................... 310/348 |
| 8,471,441 | B2 | * | 6/2013  | Tsuda .......................... 310/348 |
| 2004/0026361 | A1 | * | 2/2004  | Namba et al. .................. 216/13 |
| 2010/0301708 | A1 | * | 12/2010 | Tsuda .......................... 310/344 |
| 2011/0043078 | A1 | * | 2/2011  | Tsuda .......................... 310/364 |
| 2012/0280768 | A1 | * | 11/2012 | Nakayama et al. ........... 333/193 |
| 2013/0076458 | A1 | * | 3/2013  | Katou et al. ................. 333/195 |

FOREIGN PATENT DOCUMENTS

| JP | 2004-147220 | 5/2004 |
| JP | 2006-246112 | 9/2006 |
| JP | 2007-028172 | 2/2007 |
| JP | 2009-135635 | 6/2009 |
| JP | 2010-010812 | 1/2010 |
| JP | 2011-147097 | 7/2011 |
| JP | 2011-147098 | 7/2011 |
| WO | 2006134928 | 12/2006 |
| WO | WO 2011/145750 | * 11/2011 |

* cited by examiner

*Primary Examiner* — Barbara Summons
(74) *Attorney, Agent, or Firm* — Jianq Chyun IP Office

(57) ABSTRACT

A piezoelectric component includes a piezoelectric element that includes: a piezoelectric plate; a comb-shaped electrode and an input/output electrode on a principal surface of the piezoelectric plate; a cover layer disposed above the comb-shaped electrode; and a rib to form a void between the comb-shaped electrode and the cover layer. The cover layer includes a photosensitive thermosetting resin in which translucent filler is contained.

12 Claims, 21 Drawing Sheets

FIG. 5L
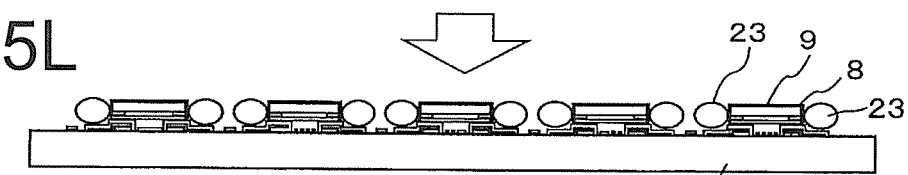
FIG. 5M
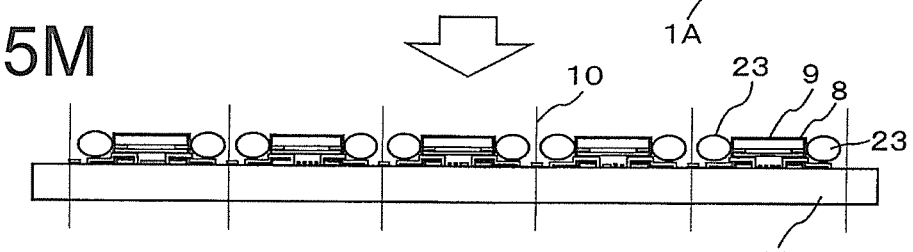
FIG. 5N
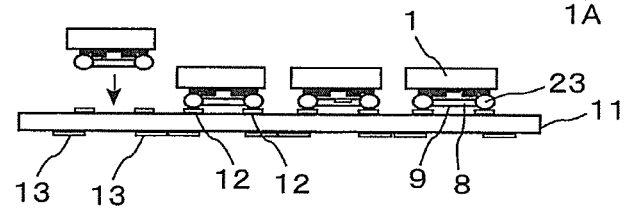
FIG. 5O
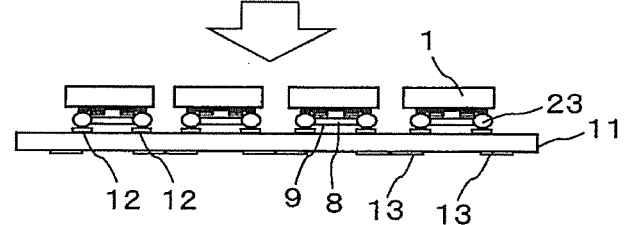
FIG. 5P
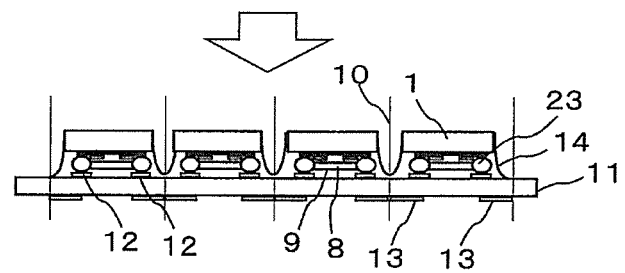
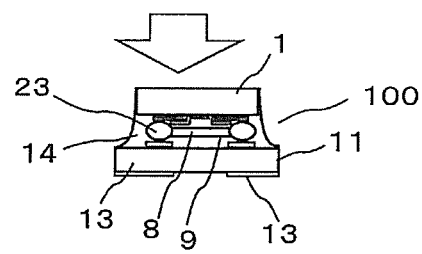

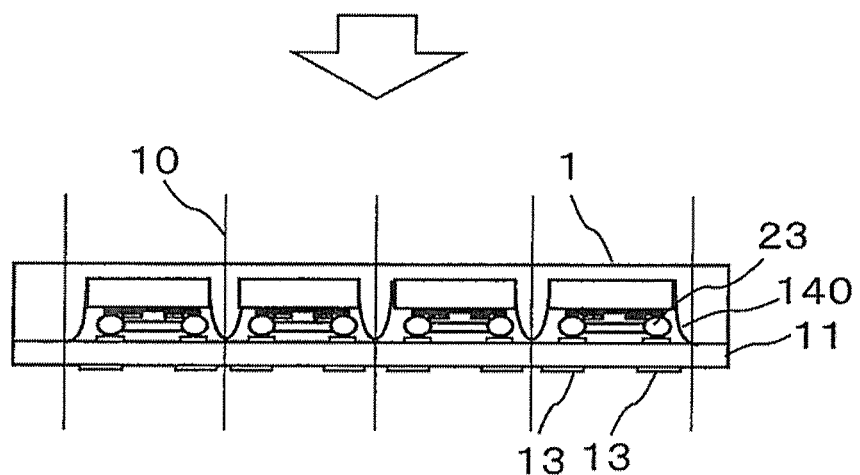
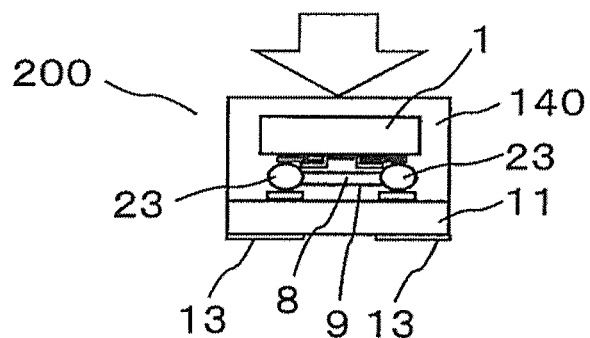
FIG. 6P'

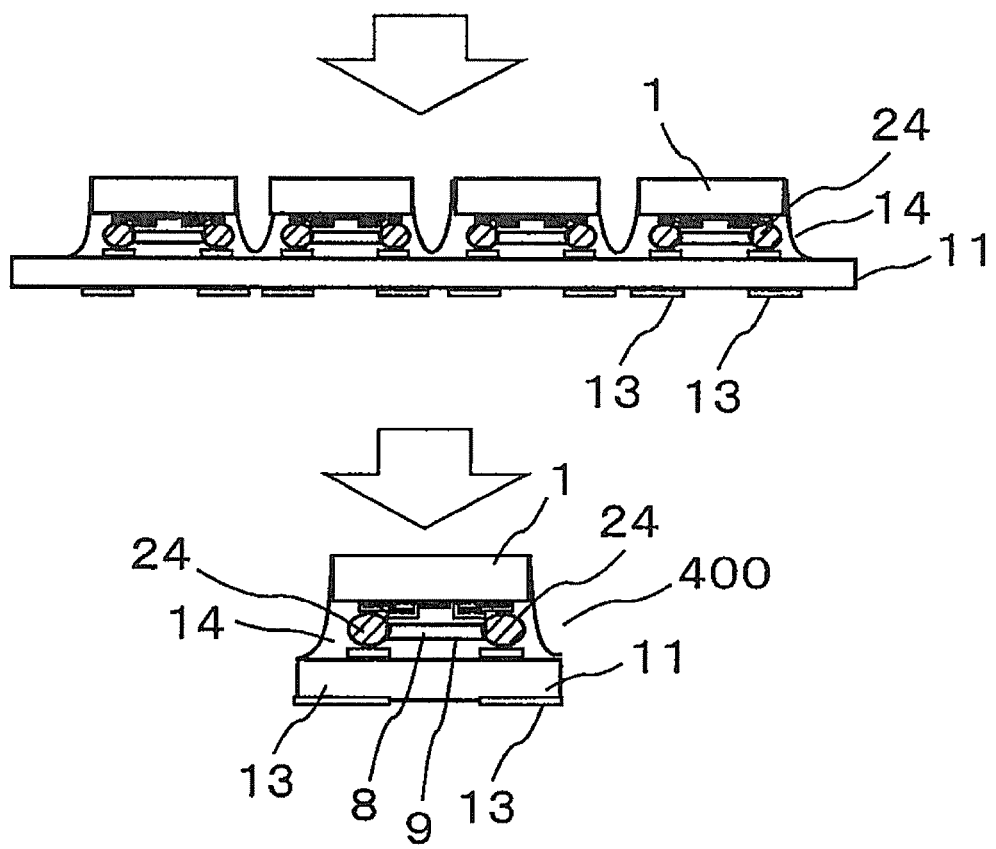
FIG. 14P"

FIG. 16N"
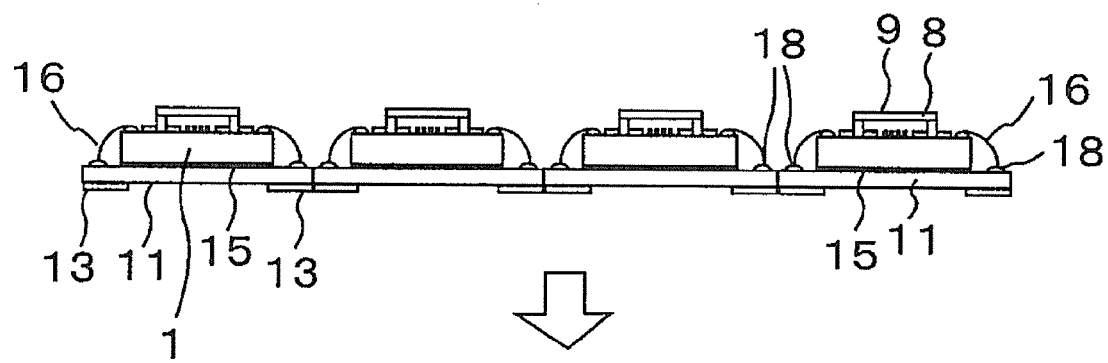
FIG. 16O"
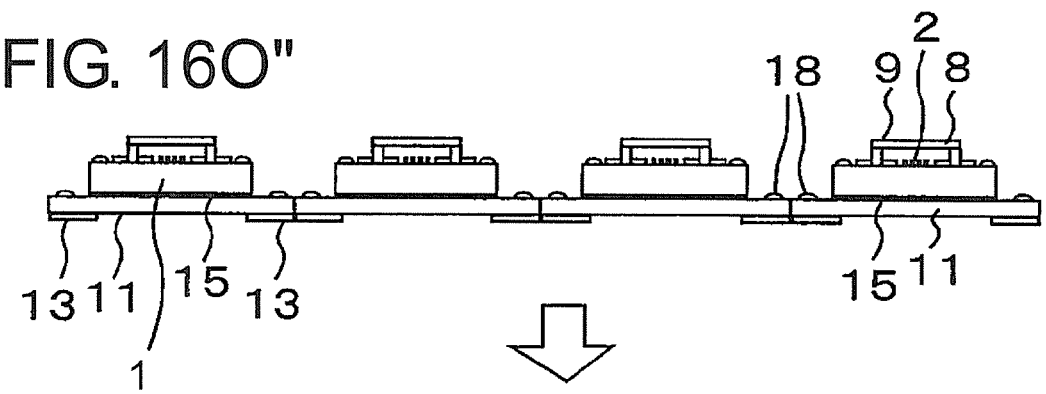
FIG. 16P"
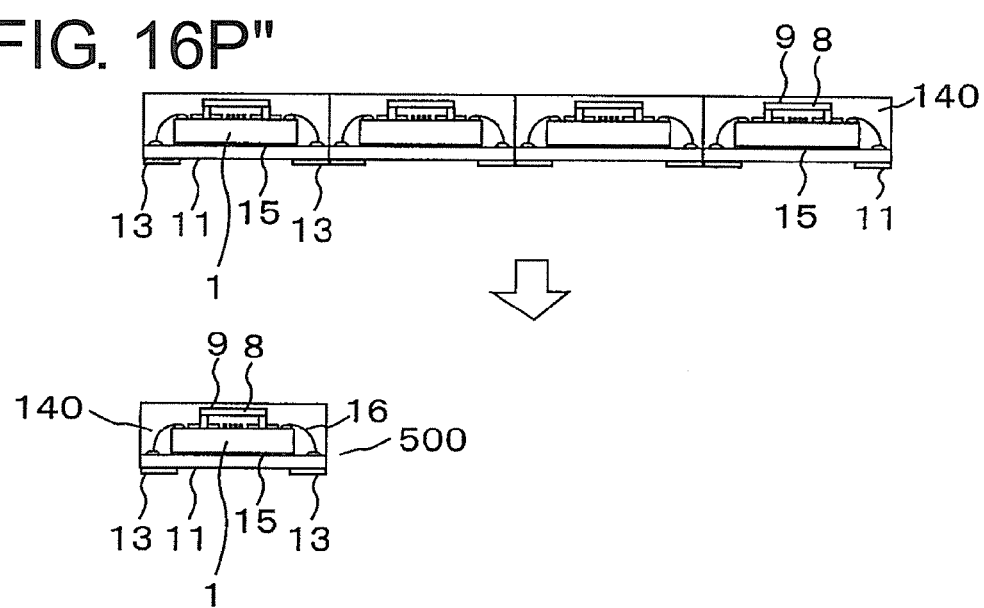

PIEZOELECTRIC COMPONENT HAVING A COVER LAYER INCLUDING RESIN THAT CONTAINS TRANSLUCENT FILLER

CROSS-REFERENCE TO RELATED APPLICATIONS

This application claims the priority benefit of Japan application serial no. 2012-250824, filed on Nov. 15, 2012 and Japan application serial no. 2012-275354, filed on Dec. 18, 2012. The entirety of the above-mentioned patent applications are hereby incorporated by reference herein and made a part of this specification.

TECHNICAL FIELD

This disclosure relates to a piezoelectric component. More particularly, this disclosure relates to: a piezoelectric component used for a facility that requires high operational stability such as a base station for mobile communication; and a piezoelectric component such as a surface acoustic wave device (SAW device), which is used for a SAW duplexer and a SAW filter, and a piezoelectric thin film filter, which are used for a mobile communication device such as a mobile phone.

DESCRIPTION OF THE RELATED ART

A piezoelectric component, which includes, for example, a surface acoustic wave device (SAW device) and a piezoelectric thin film filter used for a filter or similar component of equipment of a mobile communication base station for such as a mobile phone, is hermetically sealed in a chip size. The piezoelectric component ensures a predetermined void (vibration space portion, hollow structure, cavity) around a comb-shaped electrode (IDT electrode portion). While the piezoelectric component includes various components, a typically and widely known component is a SAW device. Thus, the following description mainly describes an example of SAW device.

In a conventional SAW device, a SAW element chip is die-bonded on a ceramic substrate having a void structure with its face up, a wire bonding electrically connects between the SAW element chip and a wiring board, and then the SAW element chip is covered with a metal cap from above with its joint sealed. This sealing is performed by seam welding or soldering, thus packaging this structure.

To downsize this type of SAW device or a similar device, recently, a chip of the SAW element is flip-chip bonded (face down bonding) to the wiring board using a gold (Au) bump or solder bump, so as to resin-seal the whole structure with resin or a similar adhesive (Japanese Unexamined Patent Application Publication Nos. 2009-135635 and 2004-147220).

To ensure a downsized and low-profiled SAW device, a predetermined void is formed around a comb-shaped electrode (IDT electrode portion), a collective piezoelectric plate (or wafer) at the comb-shaped electrode side is entirely sealed with resin with the void held, and an external connection electrode (mounting terminal) is formed. Subsequently, the collective piezoelectric plate is divided into individual SAW devices by dicing along a predetermined marking. This forms a proposed microminiaturized packaged SAW device in chip size (Japanese Unexamined Patent Application Publication Nos. 2010-10812 and 2006-246112).

Furthermore, Japanese Unexamined Patent Application Publication No. 2007-28172 discloses a structure that ensures a void. In this structure, a sheet is installed above a comb-shaped electrode to decrease the height of the void, the sheet is secured by a sealing resin and this sealing resin also fixedly secures an insulating substrate sealing the piezoelectric plate and the SAW element, and the sealing resin includes filler with an average particle diameter larger than a distance between the piezoelectric plate and the sheet.

There is a structure that ensures an operating space of an IDT with a cover layer of resin material. When molding this type of the SAW device with mold resin, the cover layer may warp and/or collapse due to the high temperature of molding, thus possibly breaking the operating space. To avoid this situation, WO2006/134928 discloses a structure where a support layer (or rib) formed of a resin material surrounding the IDT is disposed and a cover layer (which constitutes a top layer of the operating space) is disposed on the support layer so as to ensure the operating space of the IDT.

Japanese Unexamined Patent Application Publication No. 2010-10812 also discloses a structure where the operating space of the IDT formed of a rib and a cover layer of resin material similar to the above-described resin material, a rewiring layer is formed at an input/output electrode/wiring of the IDT to electrically connect an external terminal disposed on an outer surface of the cover layer and the input/output electrode/wiring, and the external terminal and the rewiring layer are connected via an electrode column passing through the cover layer. On the external terminal, a solder ball such as a conductive connection member is formed to electrically connect a mounting board in a subsequent process.

FIG. 27 is a schematic sectional view illustrating a simplified example of a conventional SAW device, where an operating space is formed of a cover layer of resin material. This SAW device 200 includes an IDT 202 formed on a surface (principal surface) of a piezoelectric plate 201. Here, the IDT 202 is constituted of a comb-shaped electrode 202a and an input/output electrode/wiring portion 202b, which receives and outputs a signal from and to the comb-shaped electrode 202a. The IDT 202 has an operating space 221 formed of a cover layer 208 made of a resin material.

The SAW device 200 illustrated in FIG. 27 includes a rewiring layer 220 formed overlapped with the input/output electrode/wiring portion 202b. On this rewiring layer 220, a rib 207 made of resin material surrounds from a peripheral area of the IDT 202, and the cover layer 208 is disposed to bridge to this rib 207. The cover layer 208 includes an external terminal (mounting terminal) 226 for mounting on an applicable electronic equipment on the surface. On this external terminal 226, a conductive connection member such as a solder ball 223 is disposed. The external terminal 226 electrically connects to the rewiring layer 220 via an electrode column 222, which passes through the cover layer 208 and the rib 207.

In a conventional piezoelectric component such as a SAW device, a piezoelectric element is housed in and secured to a package (ceramic package) formed of a ceramic material containing alumina as the main constituent, and a metal plate (lid body) is welded to an open end of a depressed portion via a metal ring, thus ensuring a void. However, a piezoelectric component that includes a container main body formed of ceramic and a metal lid body to hermetically seal is easy to fabricate, but the material cost is expensive. Since a container main body, which has a depressed portion to form a void, a piezoelectric plate, which constitutes such as a SAW element, and a metal lid body have mutually different coefficients of thermal expansion, heat impact from the outside atmosphere possibly collapses the void and breaks the airtightness.

Furthermore, in a conventional SAW device, as described in FIG. 27, the rewiring layer 220 is formed outside of the IDT 202 due to the structure. This limits the position of the external terminal 226 close to an outer periphery of the device, thus reducing freedom of choice in application of composite devices and in position of the terminal corresponding to a connection pad or similar part disposed on a mounting board of applicable equipment of customer manufacturers. The conductive connection member such as the solder ball 223 is formed on the external terminal 226 by directly forming on the external terminal 226 at the limited position on the top surface of the cover layer 208 after installation of the cover layer 208 to form the operating space. Thus, heat of, for example, the melt solder during the reflow process possibly causes deflection of the cover layer 208 and distorts the operating space.

A need thus exists for a piezoelectric component which is not susceptible to the drawback mentioned above.

SUMMARY

A piezoelectric component according to this disclosure includes a piezoelectric element that includes: a piezoelectric plate; a comb-shaped electrode and an input/output electrode on a principal surface of the piezoelectric plate; a cover layer disposed above the comb-shaped electrode; and a rib to form a void between the comb-shaped electrode and the cover layer. The cover layer includes a photosensitive thermosetting resin in which translucent filler is contained.

BRIEF DESCRIPTION OF THE DRAWINGS

The foregoing and additional features and characteristics of this disclosure will become more apparent from the following detailed description considered with reference to the accompanying drawings, wherein:

FIG. 5L to FIG. 5P are process views following FIG. 4K illustrating the fabrication method of the SAW device according to the first embodiment of the disclosure.

FIG. 6P' is a process view following FIG. 5P illustrating the fabrication method of the SAW device according to a modification of the first embodiment of the disclosure.

FIG. 14P'' is a process view illustrating the fabrication method of the SAW device according to a modification of the second embodiment of the disclosure.

FIG. 16N'' to FIG. 16P'' are main process views illustrating a fabrication method of the SAW device according to the third embodiment of the disclosure.

DETAILED DESCRIPTION

A detailed description will be given of piezoelectric components according to embodiments of this disclosure by referring to drawings. In these embodiments, this disclosure is applied to SAW devices.

First Embodiment

Figure 1A:
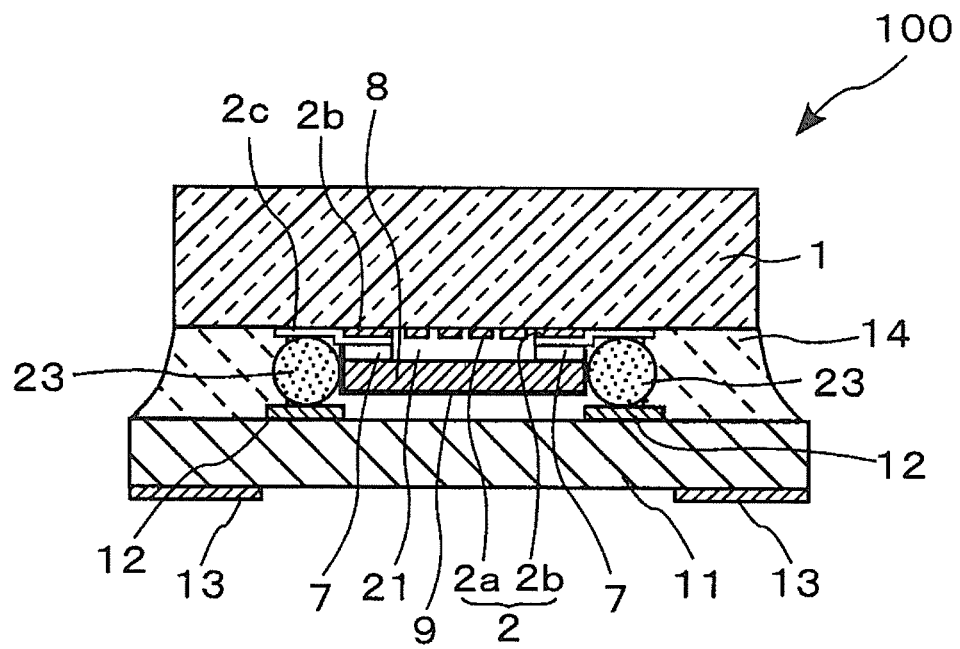
FIG. 1A and FIG. 1B are cross-sectional views illustrating a structure of a SAW device according to a first embodiment of the disclosure.
Figure 1B:
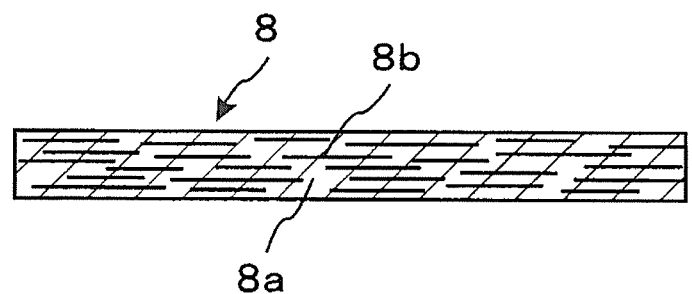

FIG. 1A and FIG. 1B are cross-sectional views illustrating a structure of a SAW device according to a first embodiment of the disclosure. FIG. 1A is a cross-sectional view of a principal part, and FIG. 1B is an enlarged cross-sectional view of a cover layer to form a cavity in FIG. 1A. The SAW device 100 of this embodiment employs a SAW element, where an interdigital transducer (IDT) 2 is formed on a principal surface of a piezoelectric plate 1 made of lithium tantalite ($LiTaO_3$). In this embodiment, the IDT 2 is formed by patterning of aluminum thin film and includes a comb-shaped electrode 2a and an input/output electrode 2b.

The input/output electrode 2b connects to an Under Bump Metal (UBM) film 2c, and a resin rib 7 is disposed at the upper side of the UBM film 2c. The rib 7 makes a sidewall to ensure a vibration space (or void) 21 for a comb-shaped electrode 2a of the IDT, together with the cover layer 8. The UBM film 2c extends outside of the void 21 and electrically connects to an electrode pad 12 on an inner surface of a wiring board 11 via the solder ball 23. The wiring board 11 is formed of a glass epoxy sheet and has a bottom surface that includes a plurality of mounting terminals 13 to be connected to electrode terminals of applicable equipment. On bonding side surfaces of the piezoelectric plate 1 and the wiring board 11 of the SAW element, a sealing resin 14 is disposed. In this embodiment, this sealing resin 14 is constituted of an injected underfill resin. This sealing resin 14 is preferred to be injected between the cover layer 8 and the wiring board 11.

As illustrated in a cross-section in the thickness direction of FIG. 1B, the cover layer 8 is constituted of a polyimide resin 8a, which emits little gas, as the base resin and a filler 8b mixed in the polyimide resin 8a. The filler 8b employs optically transparent fine-grained mica pieces. This fine-grained mica piece is a scalelike thin piece. This fine-grained mica pieces are mixed in a photosensitive thermosetting resin such that a surface of a white mica piece approximately corresponds to a plane direction of the film, and a plurality of adjacent white mica pieces are overlapped with one another in the thickness direction of the film to be overlapped in the plane direction. This constitutes the cover layer with high impact resistance property against external force and little deflection.

Figure 2:
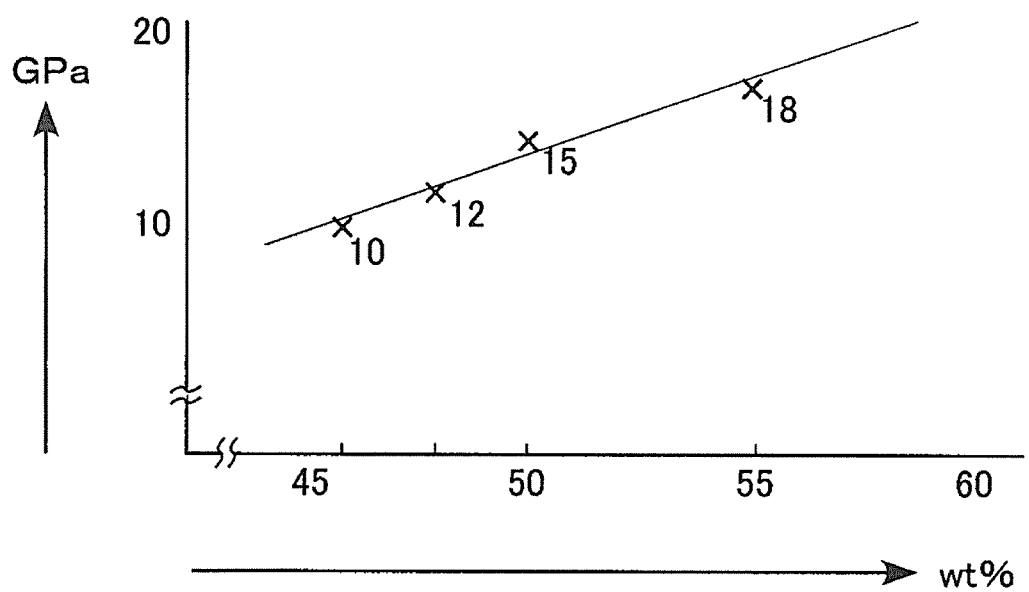
FIG. 2 is a graph illustrating an appropriate amount of fine-grained mica pieces mixed in a polyimide resin for forming a cover layer.

FIG. 2 is a graph illustrating an appropriate amount (weight percent: wt %) of filler (fine-grained mica pieces) amount mixed in a polyimide resin for forming a cover layer. The horizontal axis indicates the mixed amount (wt %) of fine-grained mica pieces, while the vertical axis indicates the strength (GPa) of the cover layer. From the aspect of reliability, it is necessary that the strength of the cover layer is not below 10 GPa. As described above, the excessive mixed amount increases brittleness and deteriorates the impact resistance property. The inventors of this application found the relationship as shown in FIG. 2 by an experiment. This relationship revealed that the mixed amount of fine-grained mica pieces is preferred to be in a range of 45 wt % to 55 wt %. Thus, in this embodiment, the mixed amount of fine-grained mica pieces was set to 50 wt %.

FIG. 3A to FIG. 3F, FIG. 4G to FIG. 4K, and FIG. 5L to FIG. 5P are process views illustrating a fabrication method of the SAW device according to the first embodiment of the disclosure. In the order of FIG. 3A to FIG. 5P, the SAW device 100 described in FIG. 1A and FIG. 1B was obtained. FIG. 6P' illustrates a modification of the first embodiment, which is sealed with a resin mold instead of the underfill. FIG. 7 to FIG. 11 are enlarged views of the principal part in the processes of FIG. 3A to FIG. 5P.

Figure 3A:
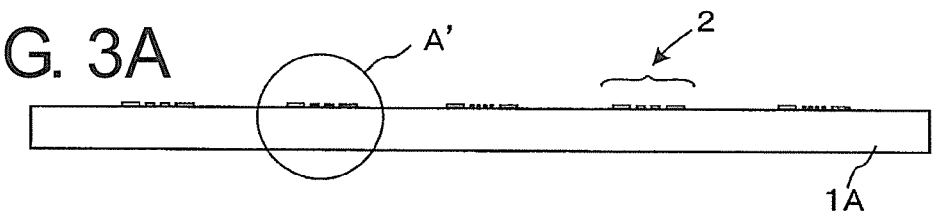
FIG. 3A to FIG. 3F are process views illustrating a fabrication method of the SAW device according to the first embodiment of the disclosure.

FIG. 3A illustrates a state where aluminum thin films are formed by sputtering or similar method on the principal surface of a piezoelectric wafer 1A made of lithium tantalite, and electrodes (the comb-shaped electrode 2a and the input/output electrode 2b) 2 of the IDT are formed by patterning using a photolithography method (hereinafter referred to as simply "photolitho"). The electrodes 2 of the IDT are illustrated in the enlarged view of FIG. 7. As illustrated, in this embodiment, the IDT 2 includes the comb-shaped electrode 2a at the central portion and the input/output electrodes 2b at both sides of the comb-shaped electrode 2a.

Figure 3B:
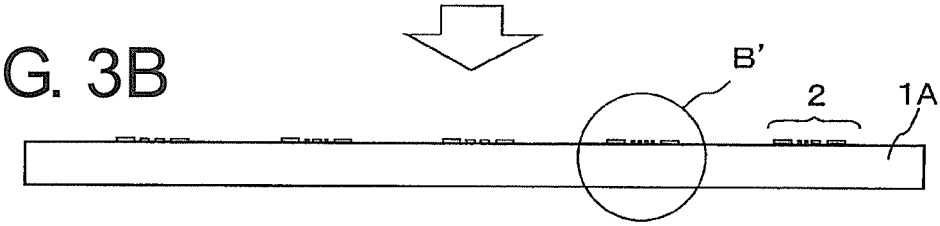
Figure 8:
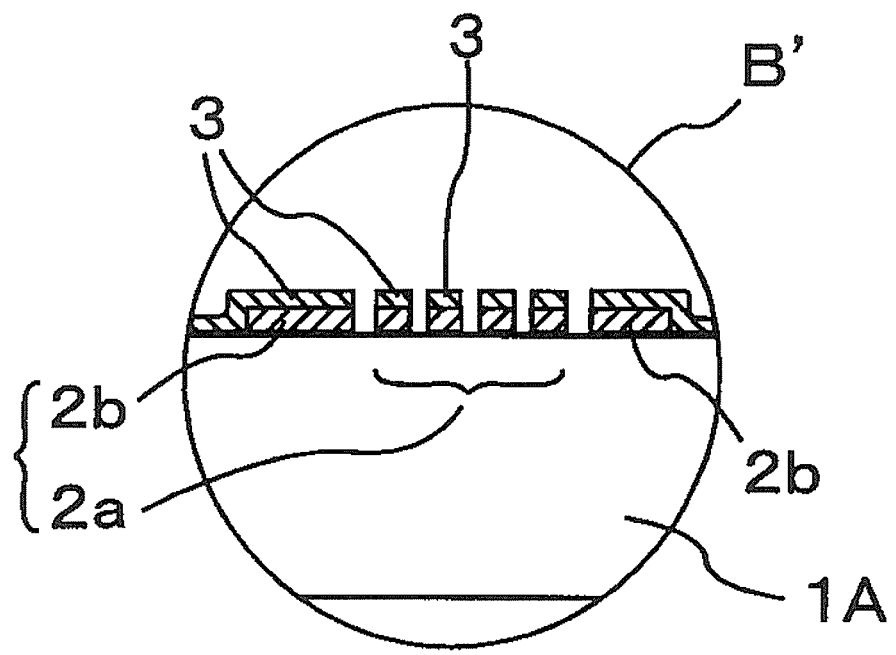
FIG. 8 is an enlarged view of another principal part in the processes of FIG. 3A to FIG. 5P.
Figure 9:
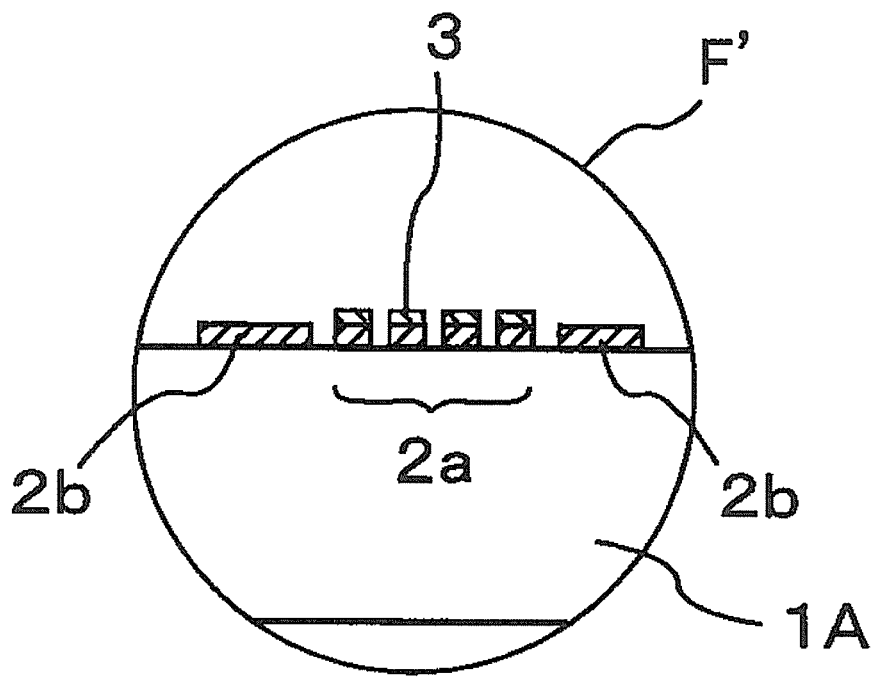
FIG. 9 is an enlarged view of another principal part in the processes of FIG. 3A to FIG. 5P.

In FIG. 3B, a silica ($SiO_2$) is formed as a protective film 3 to protect the IDT 2 made of aluminum from etching liquid in the latter photolitho process step. FIG. 8 illustrates a state where the protective film 3 is formed on the electrodes of the IDT 2.

Figure 3C:
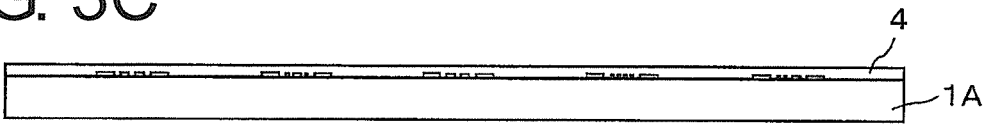
Figure 3D:
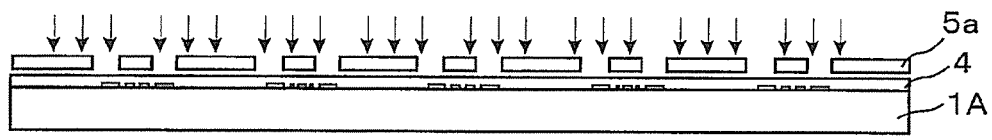
Figure 3E:
Figure 3F:
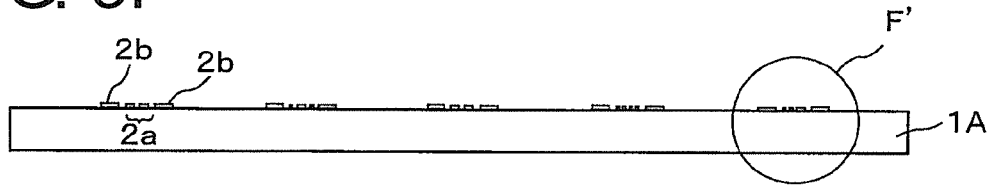

FIG. 3C illustrates a state where a photoresist 4 is applied to cover all the surfaces of the IDT 2. UV-exposure is performed on this photoresist 4 through an exposure mask 5a (FIG. 3D), development is performed to remove the photoresist at the portion of the input/output electrode 2b (FIG. 3E). The etching process removes the protective film 3 at the portion of the input/output electrode 2b, and subsequently a peeling agent peels off the photoresist and cleans the whole (See FIG. 3F and FIG. 9).

Figure 4G:
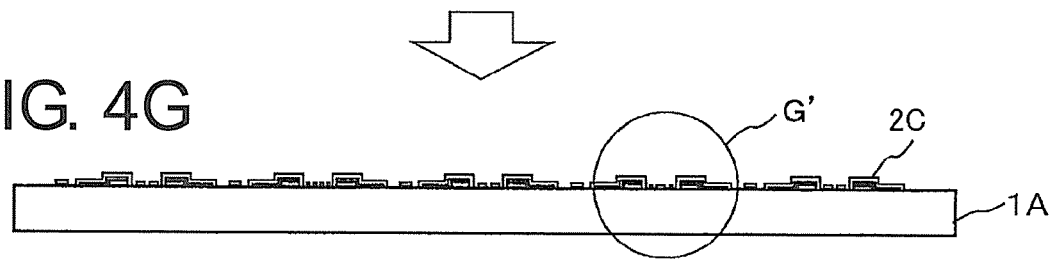
FIG. 4G to FIG. 4K are process views following FIG. 3F illustrating the fabrication method of the SAW device according to the first embodiment of the disclosure.
Figure 10:
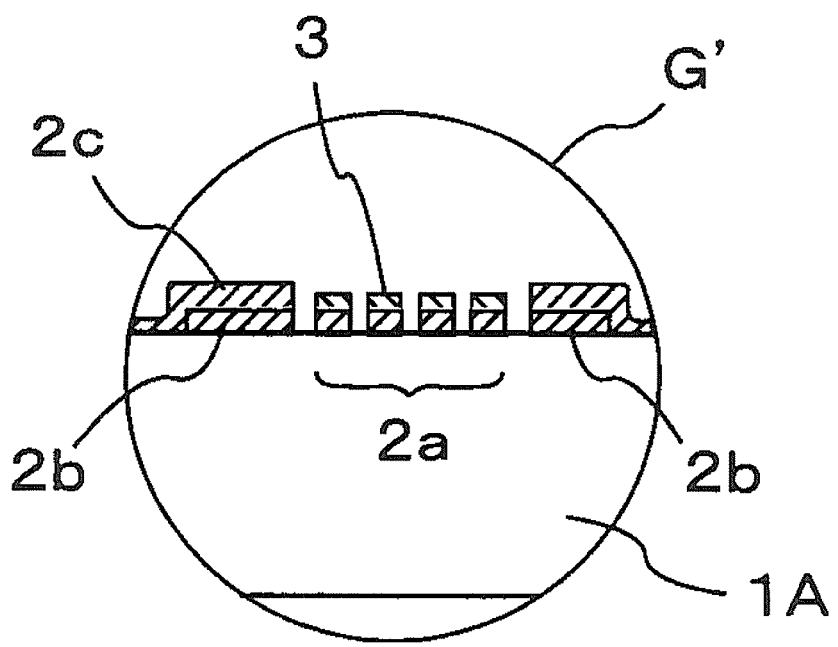
FIG. 10 is an enlarged view of another principal part in the processes of FIG. 3A to FIG. 5P.

In FIG. 4G, the Under Bump Metal (UBM) film 2c is formed at the portion of the input/output electrode 2b (See FIG. 10). The UBM film 2c is also formed by the photolitho. At this time, since the portion of the input/output electrode 2b is protected by the protective film 3, the etching liquid does not erode and the designed shape and thickness are kept.

Figure 4H:
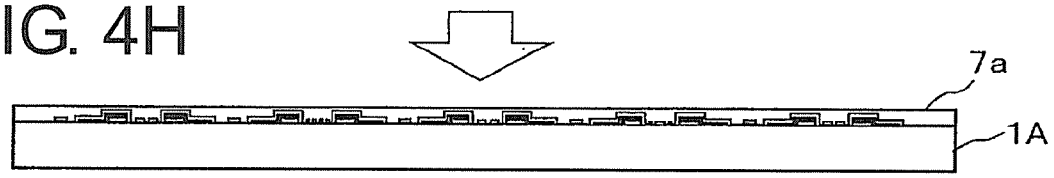
Figure 4I:
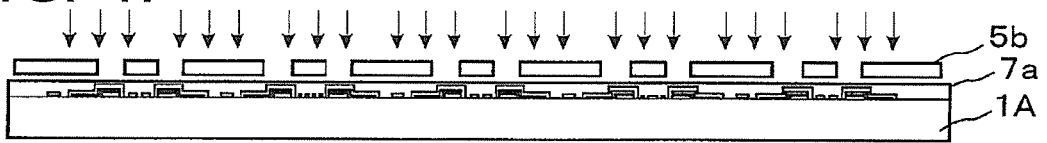
Figure 4J:
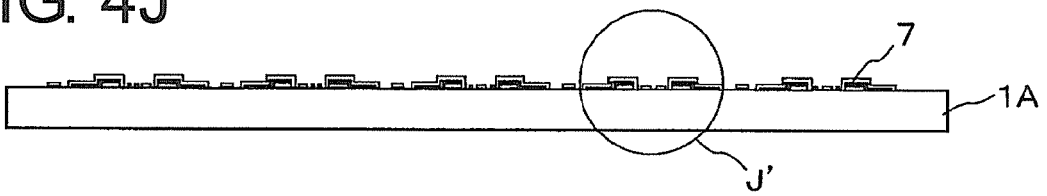
Figure 4K:
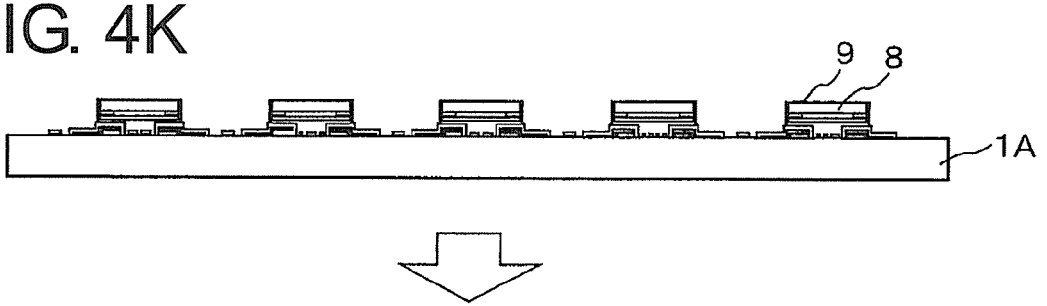
Figure 7:
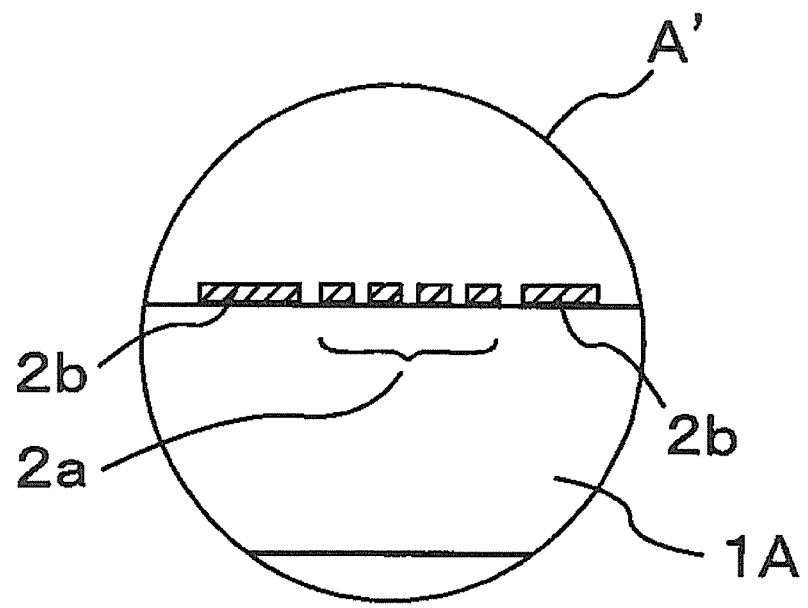
FIG. 7 is an enlarged view of a principal part in the processes of FIG. 3A to FIG. 5P.
Figure 11:
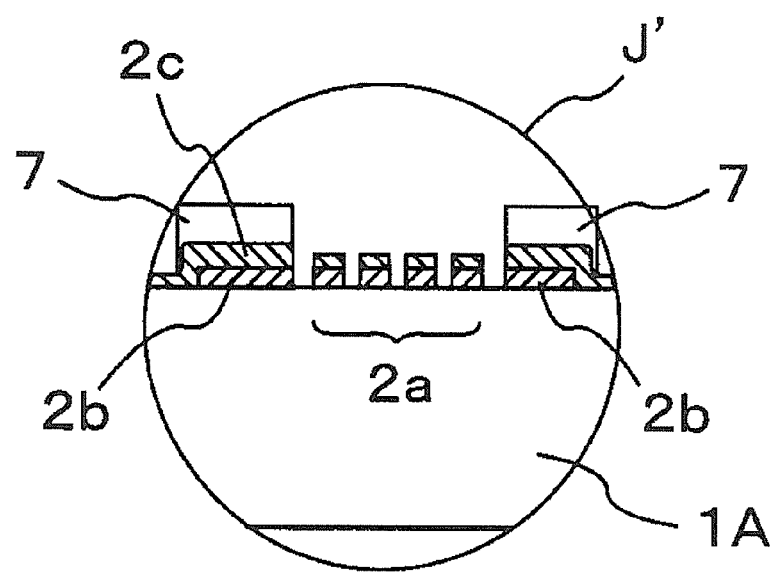
FIG. 11 is an enlarged view of another principal part in the processes of FIG. 3A to FIG. 5P.

FIG. 4H illustrates the UBM film 2c formed on the piezoelectric wafer and an attached polymer film for rib 7a that covers all the surface of the IDT 2. The polymer film for rib 7a is a photoresist. UV-exposure is performed through a photomask 5b (See FIG. 4I) to form the rib 7 on the UBM film 2c (See FIG. 4J). FIG. 11 illustrates a state where the ribs 7 are formed.

On the piezoelectric plate wafer 1A, a polyimide film including filler extends with the plurality of rib 7 as columns, and exposed through a photomask and then developed so as to form the cover layer 8 that covers over the IDT 2. The cover layer 8 in this phase, on which photo-curing is simply performed, does not have sufficient hardness, but is completely hardened in the latter heating process part. After the cover layer 8 is formed, the metal thin film 9 is deposited at least equal to or more than 3 μm thickness to hermetically seal, thus hermetically sealing the void inside (See FIG. 4K). This hermetic seal holds sufficient air tightness in a wider temperature range, thus obtaining high reliability.

Next, a photolitho using application of photoresist and photomask forms a resist opening at the portion of the input/output electrode 2b, which is a terminal portion of the IDT, to remove unnecessary metal thin film. The resist remains on the top surface and the side surface of the cover layer 8. The remaining resist electrically insulates a conductive connection member (the solder ball in this embodiment), which will be described below, from the metal thin film 9. This process is not illustrated.

FIG. 5L illustrates a state where the solder balls 23 are formed on the input/output electrode 2b, which is a terminal portion of the IDT, at the side surfaces of the cover layer 8. This solder ball 23 is supplied on the input/output electrode 2b by a known solder ball supplying equipment. Instead of this process, a solder paste may be printed and reflown so as to form a solder bump as a conductive connection member.

As illustrated in FIG. 5M, the wafer 1A where a large number of SAW elements with the solder balls 23 are mounted is divided along section lines 10 so as to separate into individual SAW elements. The separated SAW elements are mounted on a wiring board 11 of glass epoxy sheet by mount equipment (See FIG. 5N). The wiring board 11 has a principal surface with an electrode pad 12 to be bonded to the solder ball 23 of the SAW element. The wiring board 11 has the opposite surface (back surface) with the mounting terminal 13, which electrically connects to the electrode pad 12 through a via hole or similar member (not shown).

The wiring board 11 with the SAW elements passes through a reflow furnace to bond the solder balls 23 to the electrode pads 12. Then, the wiring board 11 is cleaned by a method such as plasma (See FIG. 5O).

After the cleaning, between each of the SAW element and the wiring board 11, underfill resin is injected as the sealing resin 14 and seals. The injected resin is heat hardened in the latter reflow process. Epoxy resin is preferable material for the sealing resin 14. The epoxy resin has a large thermal expansion and thermal shrinkage coefficient. Thus, the epoxy resin contains necessary amount of fine powder of silica (silicon oxide) to make a composite resin so as to suppress breakage of the bonding portion due to temperature change. After sealing with the sealing resin, this is separated along the section lines 10 into the individual SAW device 100 (See FIG. 5P).

FIG. 6P' is a cross-sectional view illustrating a modification of this embodiment. This modification has a device shape of a resin mold instead of sealing with the underfill resin 14 described with FIG. 5P. As resin for the resin mold, various kinds of epoxide-based resin are preferable. As illustrated in FIG. 6P', after the process of FIG. 5O, the whole SAW elements mounted on the wiring board 11 are resin molded. The resin mold employs compression molding, transfer molding, injection molding, or similar molding. Subsequently, this is separated along the section lines 10 into the individual SAW devices 200.

According to this embodiment, the vibration space (hollow or cavity) of the IDT is constituted of the rib formed of resin and the high strength cover layer formed of resin containing filler, and a low-price glass epoxy sheet is employed for the wiring board. This allows the fabrication process at comparatively low cost to provide a piezoelectric component with high reliability such as a SAW device.

Second Embodiment

Figure 12A:
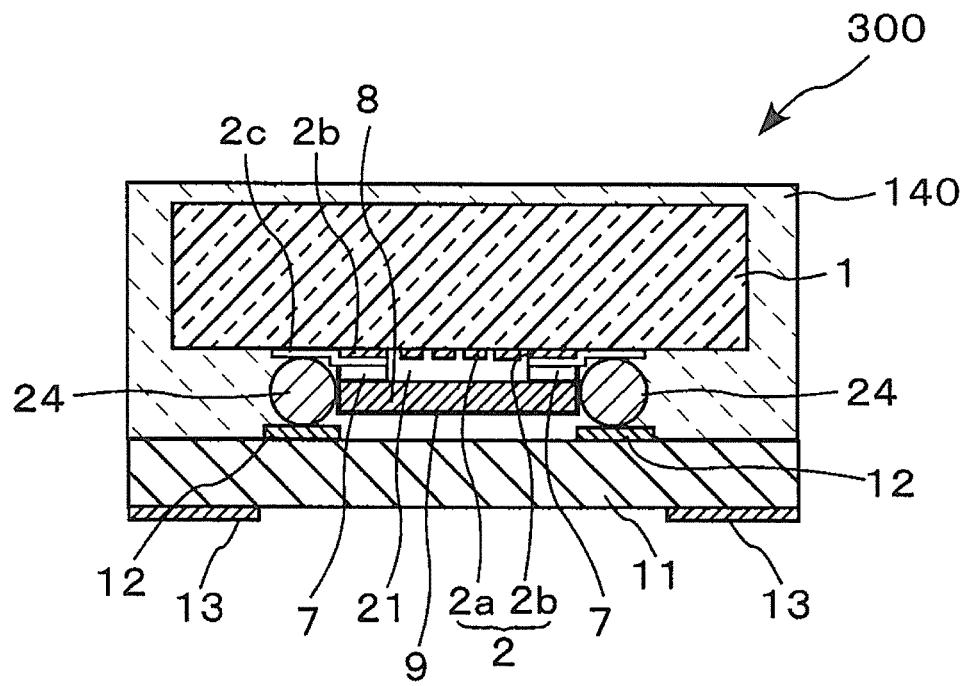
FIG. 12A and FIG. 12B are cross-sectional views illustrating a structure of a SAW device according to a second embodiment of the disclosure.
Figure 12B:
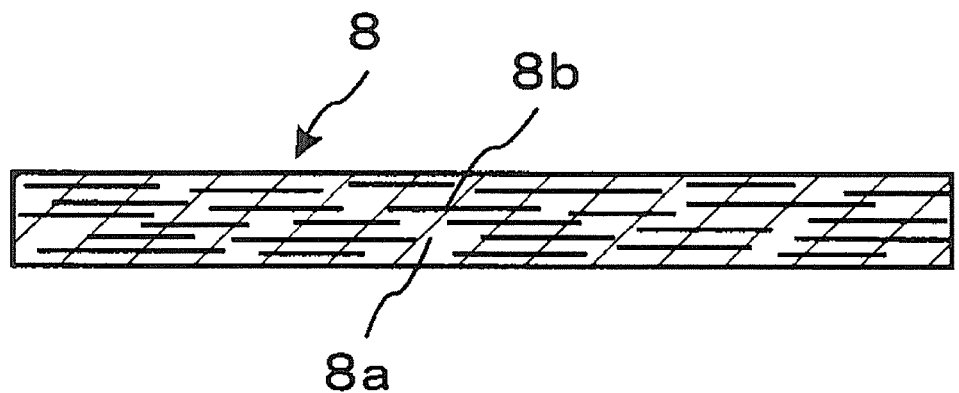

FIG. 12A and FIG. 12B are cross-sectional views illustrating a structure of a SAW device according to a second embodiment of the disclosure. FIG. 12A is a cross-sectional view of a principal part. FIG. 12B is an enlarged cross-sectional view of a cover layer to form a cavity in FIG. 12A. A SAW device 300 of this embodiment employs a SAW element where an IDT 2 is formed on a principal surface of a piezoelectric plate 1 made of lithium tantalite (LiTaO$_3$). In this embodiment, the IDT 2 is formed by patterning of aluminum thin film and includes a comb-shaped electrode 2a and an input/output electrode 2b.

This embodiment is different from the above-described first embodiment in that the SAW element and the wiring board 11 are bonded with a conductive connection member of a copper ball. The SAW device 300 illustrated in FIG. 12A and FIG. 12B is similar to the modification of the first embodiment described in FIG. 6P' except that the conductive connection member is a copper ball 24. Accordingly, a description will be given of the difference from the first embodiment (and its modifications) only.

Figure 13L:
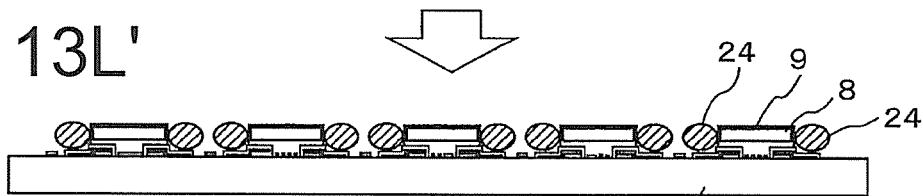
FIG. 13L' to FIG. 13P' are process views illustrating a fabrication method of the SAW device according to the second embodiment of the disclosure.
Figure 13M:
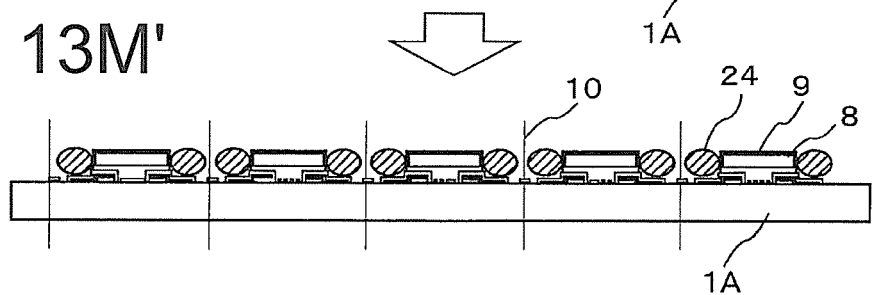
Figure 13N:
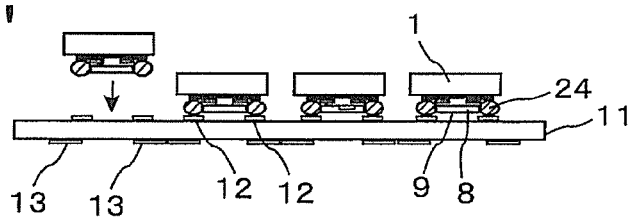
Figure 13O:
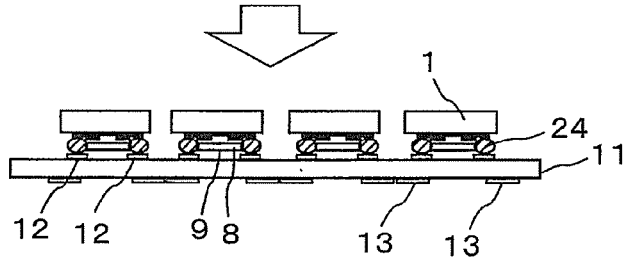
Figure 13P:
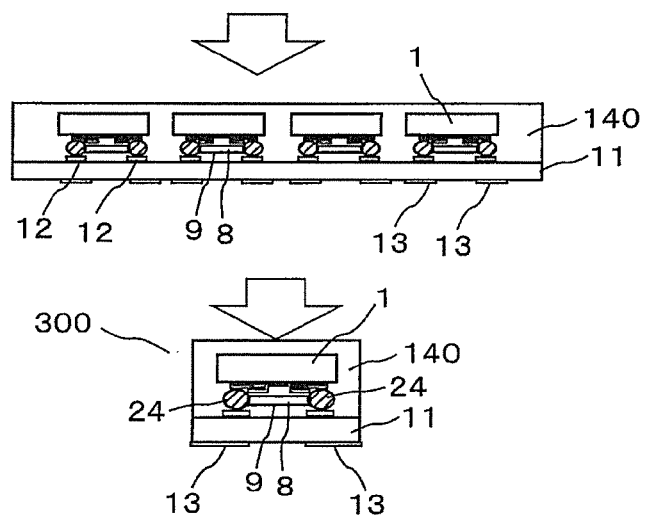

FIG. 13L' to FIG. 13P' and FIG. 14P''' are process views illustrating a fabrication method of the SAW device according to the second embodiment of the disclosure. The processes of FIG. 13L' to FIG. 14P''' respectively correspond to the processes of FIG. 5L to FIG. 5P and FIG. 6P'. FIG. 14P''' illustrates a modification of the second embodiment, which is sealed with an underfill instead of the resin mold.

In FIG. 13L', the copper ball 24 as the conductive connection member is formed in a ball shape as a protruding connection electrode on an Under Bump Metal or similar member by discharge dissolution using torch of a copper wire or a palladium (Pd) coated copper wire. After nickel plating is performed on this copper ball, a solder paste is applied and a reflow process is performed. The processes of FIG. 13M' to FIG. 13O' are similar to the processes of FIG. 5M to FIG. 5O except that the conductive connection member is the copper ball 24.

The process of FIG. 13P' corresponds to the process of FIG. 6P', a resin mold 140 seals to fabricate the SAW device 300.

The process of FIG. 14P''' corresponds to the process of FIG. 5P. The process of FIG. 14P''' is different from the one illustrated in FIG. 5P in that the SAW device 400 having the copper ball 24 as the conductive connection member is employed. FIG. 14P''' illustrates a modification of the second embodiment, which is sealed with an underfill instead of the resin mold.

According to also this embodiment, the vibration space (hollow or cavity) of the IDT is constituted of the rib formed of resin and the high strength cover layer formed of resin containing filler, and a low-price glass epoxy sheet is employed for the wiring board. This allows the fabrication process at comparatively low cost to provide a piezoelectric component with high reliability such as a SAW device.

Third Embodiment

Figure 15A:
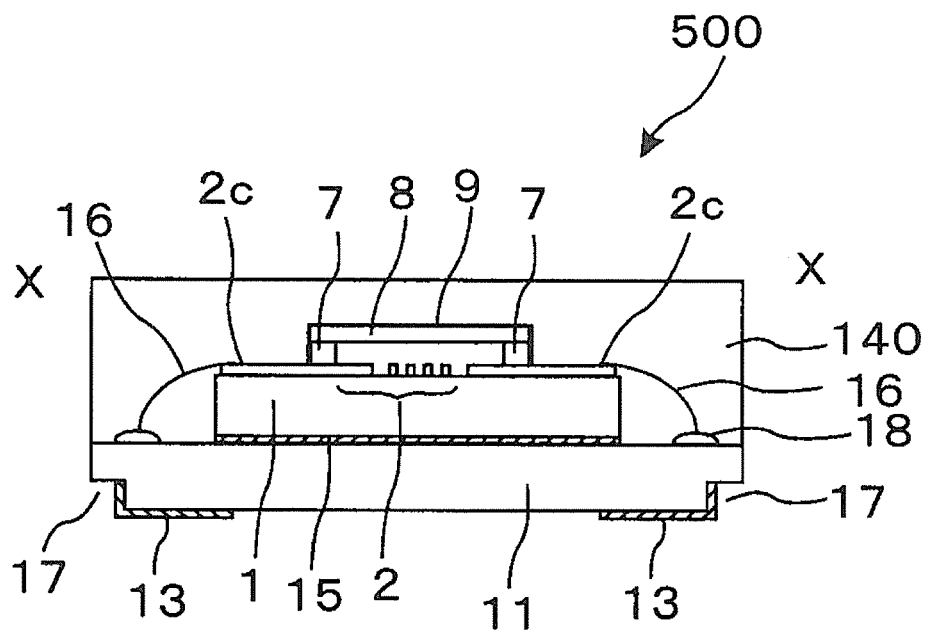
FIG. 15A to FIG. 15C are views illustrating a structure of a SAW device according to a third embodiment of the disclosure.
Figure 15B:
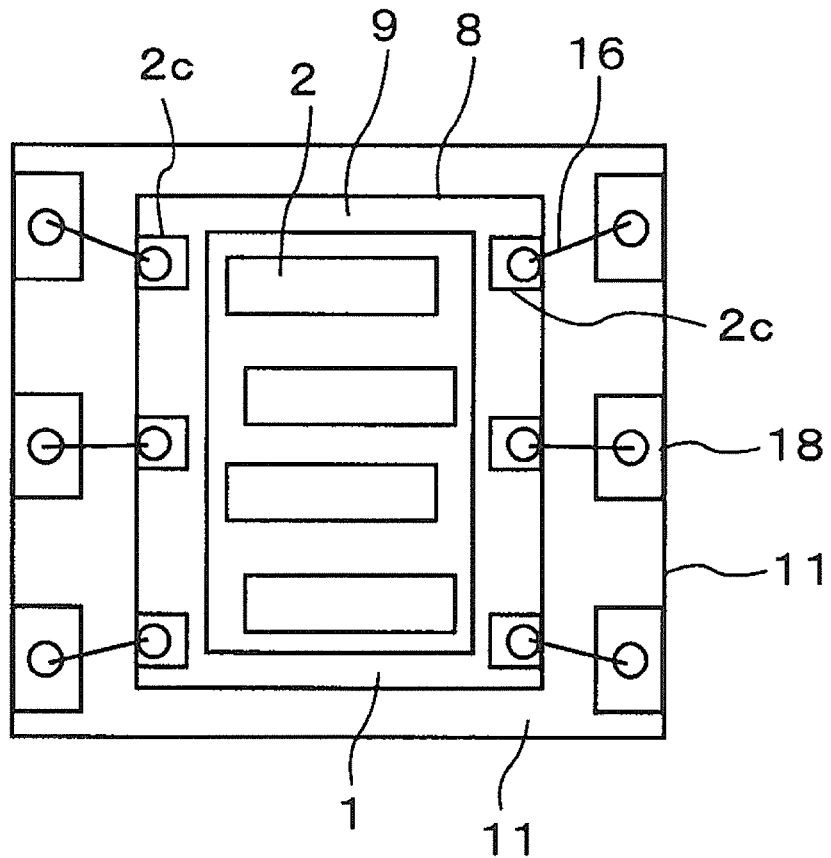
Figure 15C:
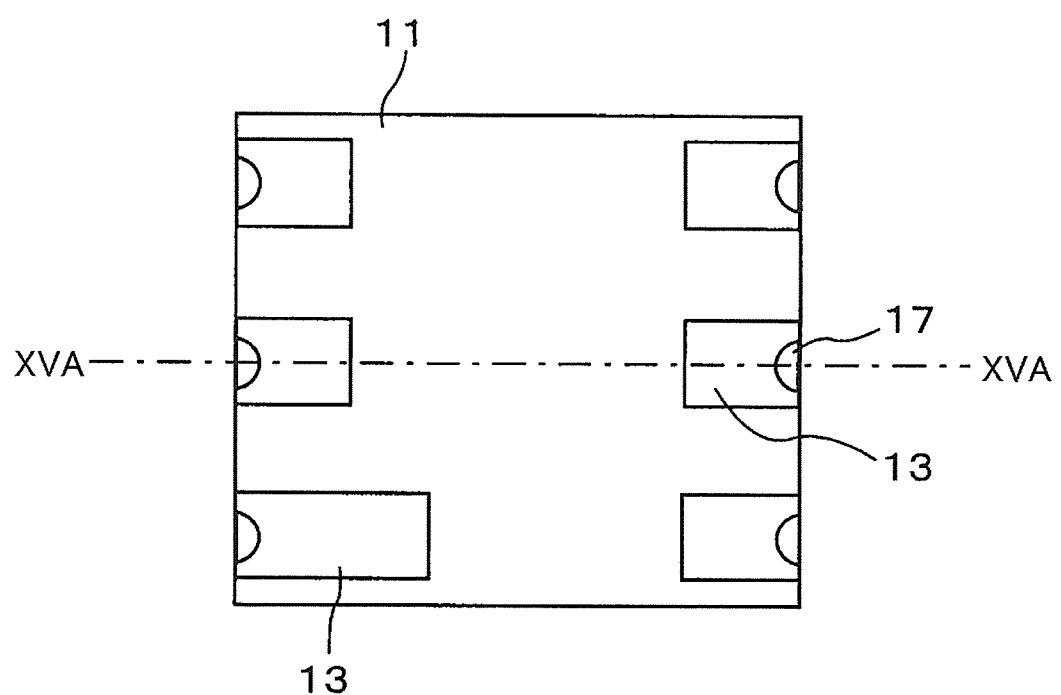

FIG. 15A to FIG. 15C are views illustrating a structure of a SAW device according to a third embodiment of the disclosure. FIG. 15A is a cross-sectional view of a principal part. FIG. 15B is a top view of the SAW device transparently viewed through a cover layer that forms a cavity of FIG. 15A. FIG. 15C is a back view of the SAW device of FIG. 15A. FIG. 15A corresponds to a cross-section taken along XVA-XVA of FIG. 15C. A SAW device 500 of this embodiment employs a SAW element where an IDT 2 is formed on a principal surface of a piezoelectric plate 1 made of lithium tantalite (LiTaO$_3$). In this embodiment, the IDT 2 is formed by patterning of aluminum thin film and includes a comb-shaped electrode and an input/output electrode, similarly to the respective above-described embodiments.

In this embodiment, as illustrated in FIG. 15A to FIG. 15C, the SAW elements of the above-described embodiments are turned upside down and mounted on the wiring board 11. In this embodiment, a conductive connection member (the solder ball or similar member) to bond to the wiring board 11 is not necessary. That is, the piezoelectric plate 1, which constitutes the SAW element, has the top surface on which the IDT 2 is formed and the back surface to which the wiring board 11 is secured with adhesive agent 15. Subsequently, the UBM film 2c, which connects to the input/output electrode of the IDT 2, and a wiring board side electrode terminal 18 are connected with a wire 16. Reference numeral 17 denotes a cutout (castellation) for forming the mounting terminal 13 of the wiring board.

FIG. 16N'' to FIG. 16P''' are main process views illustrating a fabrication method of the SAW device according to the third embodiment of the disclosure. FIG. 16N'' to FIG. 16P''' respectively correspond to FIG. 13N' to FIG. 13P'. As illustrated in FIG. 16N'' to FIG. 16P''', the piezoelectric plate 1, which constitutes the SAW element, is mounted on the wiring board 11 with the cover layer 8 facing the opposite side of the wiring board 11. The SAW element and the wiring board 11 are connected by the wire 16 and sealed by a resin mold. The SAW device according to the third embodiment is otherwise similar to the above-described embodiments.

According to this embodiment, the vibration space (hollow or cavity) of the IDT is constituted of the rib formed of resin and the high strength cover layer formed of resin containing filler, a low-price glass epoxy sheet is employed for the wiring board, and the SAW element and the wiring board are electrically connected by the wire. This ensures high impact resistance property, compared with the above-described embodiments. Use of the wire in this embodiment allows the fabrication process at the lower cost to provide a piezoelectric component with high reliability such as a SAW device.

The piezoelectric component according to this disclosure includes a piezoelectric element according to this disclosure (typically, a SAW element). The piezoelectric element includes: a piezoelectric plate with a principal surface on which necessary pattern such as a comb-shaped electrode and its input/output electrode constituting an IDT and wiring; a cover layer disposed above the IDT; a rib to form a void between the IDT and the cover layer; an Under Bump Metal (UBM) film disposed at an underlayer of the rib; a metal thin film (hermetic seal film formed by evaporation or similar method) that covers the cover layer to hermetically seal the void; a conductive connection member such as a metal bump of for example, solder, a solder ball (including copper core solder ball), or a copper ball disposed outside of the cover layer to electrically connect to the input/output electrode; a wiring board with a pad electrically connecting to the conductive connection member so as to sandwich the principal surface of the piezoelectric plate with the piezoelectric plate. At least a side peripheral portion where the piezoelectric plate and the wiring board are bonded is sealed by resin injection or molded. In this description, the piezoelectric element may also be specifically referred to as a SAW element.

The cover layer is constituted of a resin film where translucent filler is mixed in a photosensitive thermosetting resin. The resin film employs a polyimide resin, which emits little gas, as a preferred base resin. A photosensitizing agent, a coupling agent, and other modifier are added to produce a photosensitive thermosetting resin, and white mica pieces (hereinafter referred to as mica filler or simply filler) are mixed. The white mica pieces are small pieces as translucent filler. This filler does not block exposure light such as ultraviolet rays and allows transmitting through the inside of the resin film, thus ensuring accurate tenting process.

The mica filler is a scalelike thin piece. This mica filler is mixed in the photosensitive thermosetting resin, such that, a surface of this mica filler approximately corresponds to a plane direction of the photosensitive thermosetting resin film, and a plurality of adjacent fillers are overlapped with one another in the thickness direction of the film to be also sequentially overlapped in the plane direction. This increases mechanical strength the cover layer. The filler mixed in the photosensitive thermosetting resin is not limited to white mica pieces. Any material may be used insofar as the material has equivalent translucency, and provides the photosensitive thermosetting resin with mechanical strength.

The small mixed amount of filler decreases mechanical strength, particularly suppressing effect of deflection, thus making it difficult to maintain the void, while the excessive mixed amount increases brittleness and makes it easy to crack. The piezoelectric plate is constituted of, for example, crystal or $LiTaO_3$. In the case where, for example, a piezoelectric plate of $LiTaO_3$ is employed, making the coefficient of thermal expansion of the cover layer close to that of the piezoelectric plate avoids delamination of the cover layer and breakage of the void due to thermal strain. This requires a pressure resistance of equal to or more than 10 GPa. Considering this, from the experimentally obtained relationship between the mixed amount (weight percent: wt %) and the pressure resistance property of the resin with this filler, the mixed amount of white mica pieces is preferably set to 45 wt % to 55 wt % (For example, the distance between the ribs is 5 μm to 10 μm and the thickness of the cover layer is 25 μm to 35 μm).

The above-described conductive connection member is constituted by disposing a solder ball (including a solder ball with polymer core or a solder ball with copper core), a copper ball, a solder bump, a gold bump, or similar member at an outer end portion of the cover layer. The copper ball as the conductive connection member is formed in a ball shape as a protruding connection electrode on an Under Bump Metal or similar member by discharge dissolution using torch of a copper wire or a palladium (Pd) coated copper wire. The copper ball is an optimum bonding member for three dimensionally mounting of a semiconductor. After nickel plating is performed on this copper ball, a solder paste is applied and a reflow process is performed. The copper ball may be used as what is called Controlled Collapse Chip Connection (C4 connection). The nickel plating is not essential, and is not necessary if a palladium coated copper wire is employed. The copper ball is excellent in thermal fatigue resistance property compared with connection by copper core solder ball. This is employed in one embodiment of this disclosure.

When this SAW element is connected to the wiring board via the conductive connection member, a flux is applied over the conductive connection member to remove an oxidized film on the surface and then soldered in $N_2$ reflow furnace. If the flux is not used, the process is performed in a formic acid (HCOOH) atmosphere. The flux is removed by an appropriate cleaning with cleaning agent thereafter. If the formic acid is employed, this dissipates by the reflow and may not remain in the product.

A tenting forms a cover layer that employs a photosensitive thermosetting resin film in which filler is mixed. In the tenting, the filler-containing photosensitive thermosetting resin covers the IDT portions of the plurality of SAW elements in the wafer-shaped stage, and extends while keeping a predetermined clearance with the ribs disposed at the peripheral area of the IDT portion of each SAW element. This film is irradiated with ultraviolet light or similar light through an exposure mask, and then developed to leave a portion for forming the cover layer and remove the other portion. The remaining film is heat hardened in the reflow process to make the cover layer with a required hardness.

In another embodiment of this disclosure, the opposite surface (back surface) of the principal surface (the surface for forming the IDT portion of the piezoelectric plate) of the SAW element with the cover layer is die bonded on the wiring board, and an electrode terminal of this wiring board is electrically connected to the input/output electrode of the SAW element by wire bonding.

After principal parts of the SAW elements are assembled in a state of wafer, this is separated into individual SAW elements and sealed at least side peripheral portions where the piezoelectric plates and the printed circuits are bonded with underfill resin, or separated into individual SAW elements where the whole SAW elements are preliminary resin molded except mounting terminals of the circuit board before the separation. These processes form individual electronic components and then the individual electronic components are shipped after inspection process. The resin mold may employ compression molding, transfer molding, injection molding, or similar molding.

The large number of voids (hollow structure, or also referred to as cavity), which are IDT vibration spaces of the SAW elements on the piezoelectric plate, are formed with the cover layer by tenting using a resin film in a state of wafer. The top surface of the cover layer is coated with a metal thin film to make a sealed structure, thus ensuring the voids with proper airtightness. It is preferred that the resin film, which constitutes the cover layer, employ a polyimide resin emitting little gas as the base resin. Mixing a required amount of white mica pieces as translucency filler in this resin makes the coefficient of thermal expansion close to that of the piezoelectric plate, so as to ensure the cover layer with high strength for protecting the void from compression and collapse.

The SAW elements separated into individual elements are mounted on a wiring board, and electrodes of the IDT and terminal electrodes of the wiring board are integrally bonded with, for example, a solder using conductive connection members such as solder ball and copper ball. While the circuit board may employ a ceramic substrate or a glass epoxy resin board, in this disclosure, a glass epoxy resin board, which is low-price compared with a ceramic substrate, is employed. Then, the circuit board is separated into each device. Required portions (side surface where the SAW element and the wiring board are connected, and clearance including between the cover layer and the wiring board) of the separated individual devices are filled with underfill resin, or the whole device is resin molded, so as to obtain the piezoelectric component (the SAW device). On the opposite surface of the surface where the SAW element of the circuit board is mounted, mounting terminals are formed for being mounted on applicable equipment. When resin molding, the surface where these mounting terminals are formed are avoided for resin molding.

This disclosure provides the highly reliable piezoelectric component having a cavity with an excellent thermal shock property, a high accuracy, and hermetically sealed at comparatively low cost.

Fourth Embodiment

Figure 17A:
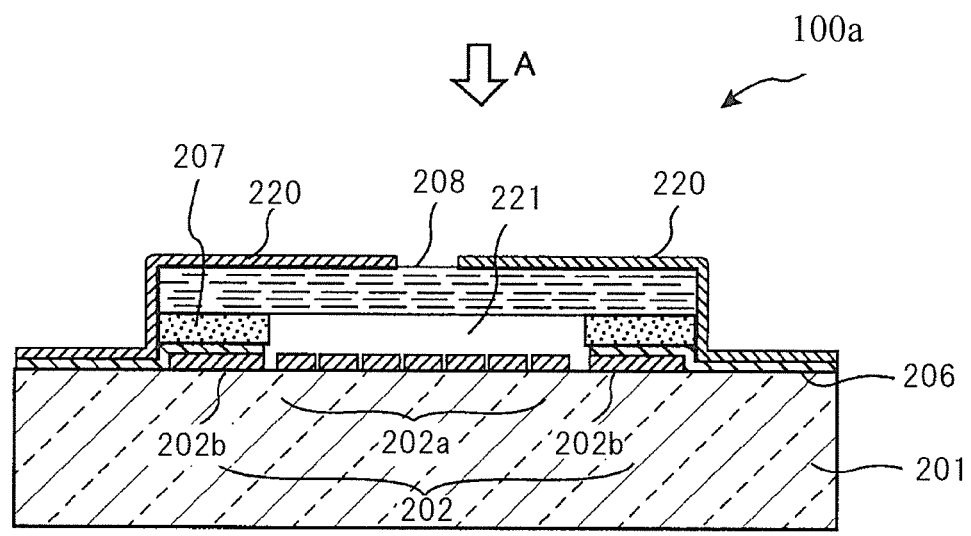
FIG. 17A and FIG. 17B are cross-sectional views illustrating a structure of a SAW device according to a fourth embodiment of the disclosure.
Figure 17B:
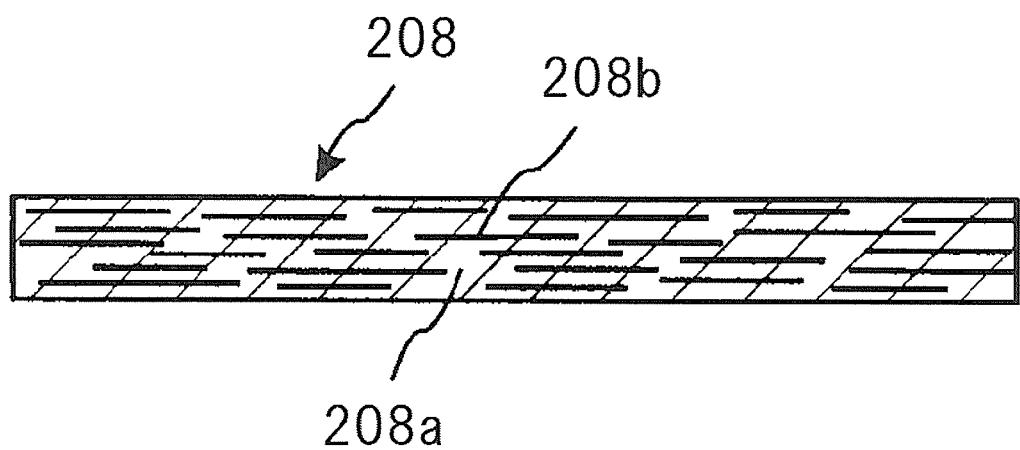
Figure 18:
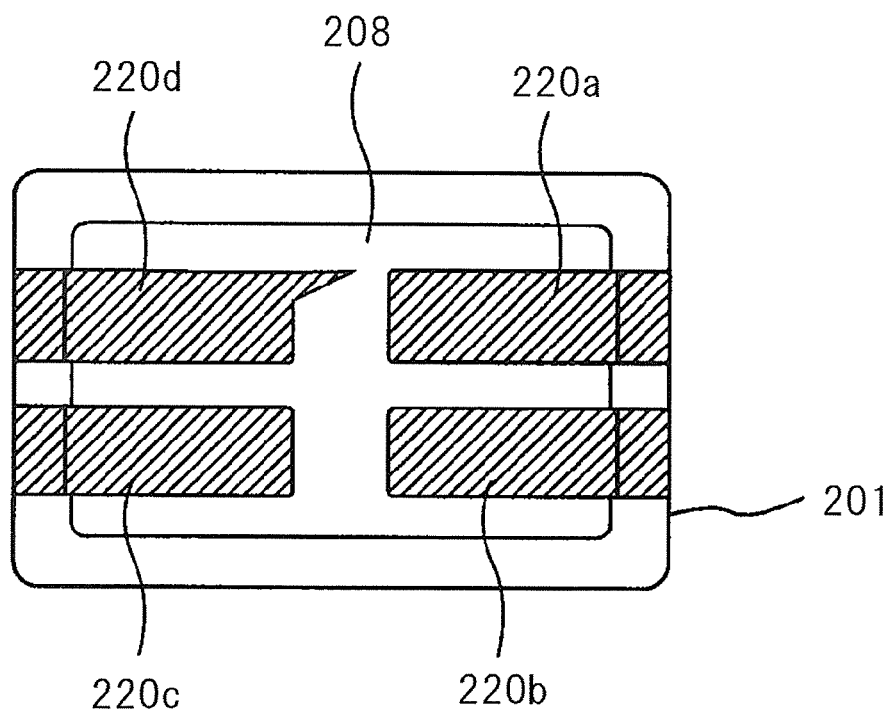
FIG. 18 is a plan view of the SAW device in FIG. 17A viewed from the arrow "A" direction.

FIG. 17A and FIG. 17B are cross-sectional views illustrating a SAW device according to a fourth embodiment of the disclosure. FIG. 17A is a schematic cross-sectional view. FIG. 17B is a schematic cross-sectional view illustrating an enlarged cover of FIG. 17A. FIG. 18 is a plan view of the SAW device of FIG. 17A viewed from the arrow "A" direction. As illustrated in FIG. 17A, the SAW device 100a has a principal part where an IDT electrode 202 is formed on one surface (principal surface) of a piezoelectric plate 201. The IDT electrode 202 includes a comb-shaped electrode 202a and an input/output electrode/wiring portion 202b, which receives and outputs a signal from and to the comb-shaped electrode 202a and electrically connects to outside of the component. The number of the IDTs of the IDT structure of FIG. 17A and FIG. 17B is only one to simplify the explanation, two or more compositely formed IDTs may be included in this embodiment. This is similarly applied to other embodiments described below. The piezoelectric plate 201 is constituted of lithium tantalite (LiTaO$_3$). In addition to this, the piezoelectric plate 201 may use lithium niobate (LiNbO$_3$), crystal, or similar material.

The IDT electrode 202 is formed by depositing aluminum (Al) thin film on the principal surface of the piezoelectric plate 201, and by patterning this using a photolithography method (hereinafter referred to as simply "photolitho"). A metal electrode layer 206, which is preferably made of aluminum, extends from above the input/output electrode/wiring portion 202b of the IDT electrode 202 to the outer edge of the piezoelectric plate 201. The rib 207 is disposed on the input/output electrode/wiring portion 202b and on the metal electrode layer 206, surrounding the comb-shaped electrode 202a of the IDT 202. This rib 207 is constituted of resin and supports the cover layer 208 so as to ensure an operating space 221 for the comb-shaped electrode 202a of the IDT 202.

The material of the IDT electrode 202 is not limited to the above-described aluminum. The IDT electrode 202 may be constituted of single layer film or multi-layer film of: metallic material main constituent of which is any of Cu, Au, Cr, Ru, Ni, Mg, Ti, W, V, Mo, Ag, In, Sn; compound of these materials and oxygen, nitrogen, silicon; alloy of these metal; or intermetallic compound.

As illustrated in FIG. 17B, the cover layer 208 of this embodiment is a film-shaped member where fine-grained white mica pieces 208b is mixed as filler in a thermosetting polyimide 208a with photosensitizing agent, curing aid agent, and similar agent being added. This fine-grained white mica piece 208b has a translucency, which has an effect of allowing exposure light (ultraviolet light or similar light) to sufficiently reach also in the thickness direction of the film at a photolitho process in patterning after attaching a film at a wafer stage. Hereinafter, the fine-grained white mica pieces (also referred to as mica filler or simply filler) are mixed. This filler does not block exposure light such as ultraviolet rays and allows the exposure light to transmit through the inside of the resin film, thus ensuring accurate tenting process. The resin employed for the cover layer 208 is not limited to the above-described polyimide. Any resin may be used insofar as the resin is thermosetting and emits little gas.

The mica filler has a physical shape of scalelike thin piece. This mica filler is mixed in the photosensitive thermosetting resin, such that a surface of this mica filler approximately corresponds to a plane direction of the photosensitive thermosetting resin film, and a plurality of adjacent fillers are overlapped with one another in the thickness direction of the film to be also sequentially overlapped in the plane direction. This increases mechanical strength of the cover layer. The filler mixed in the photosensitive thermosetting resin is not limited to white mica pieces. Any material may be used insofar as the material has equivalent translucency, and provides the photosensitive thermosetting resin with mechanical strength.

The small mixed amount of filler decreases mechanical strength, particularly suppressing effect of deflection, thus making it difficult to maintain the void, while the excessive mixed amount increases brittleness and makes it easy to crack. The piezoelectric plate is constituted of, for example, crystal or LiTaO$_3$. In the case where a piezoelectric plate of LiTaO$_3$ is employed, for example, making the coefficient of thermal expansion of the cover layer close to that of the piezoelectric plate avoids delamination of the cover layer and breakage of the void due to thermal strain. This requires a pressure resistance of equal to or more than 10 GPa.

Figure 19:
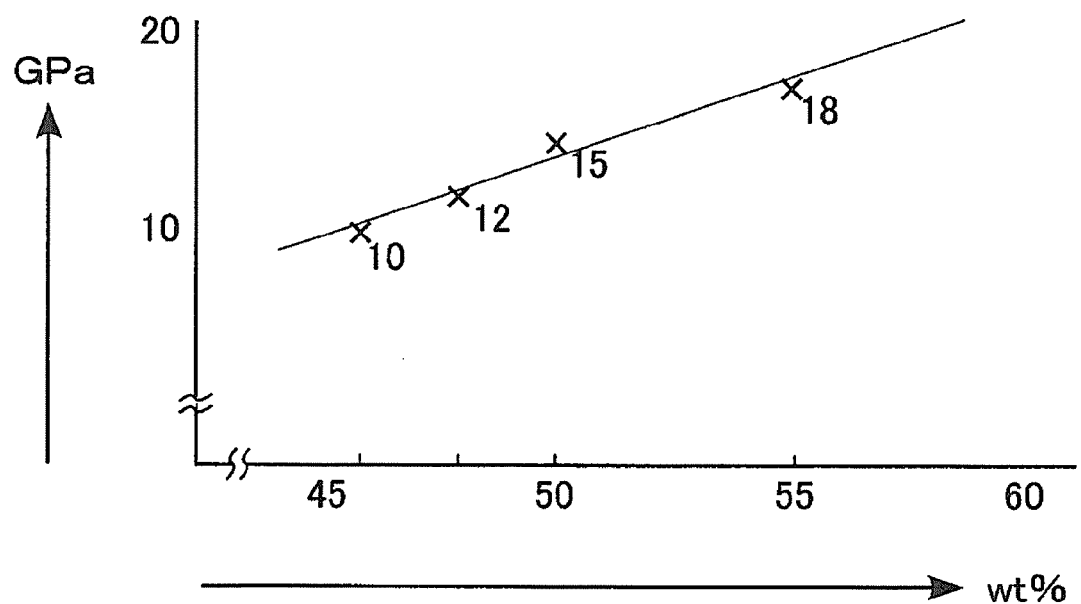
FIG. 19 is a graph illustrating an appropriate amount (weight percent: wt %) of filler (fine-grained mica pieces) amount mixed in a polyimide resin for forming a cover layer.

FIG. 19 is a graph illustrating an appropriate amount (weight percent: wt %) of filler (fine-grained mica pieces) amount mixed in the polyimide resin for forming the cover layer. The horizontal axis indicates the mixed amount (wt %) of fine-grained mica pieces while the vertical axis indicates the strength (GPa) of the cover layer. When resin molding this type of device, high pressure is applied, for example, high pressure of about 5 GPa to 15 GPa is applied for transfer molding. This requires strength of the cover layer not less than 10 GPa.

As described above, the excessive mixed amount increases brittleness and deteriorates the impact resistance property. The inventor of this application found the relationship illustrated in FIG. 19 by an experiment. Based on this relationship, considering the experimentally obtained relationship between the mixed amount (weight percent: wt %) and the pressure resistance property of the resin with this filler, in the case where the distance between the ribs (the distance between both ends supported by the rib 207) is 5 μm to 10 μM and the thickness of the cover layer 208 is 25 μm to 35 μm, the mixed amount of white mica pieces is set to 40 wt % to 60 wt %, preferably, 45 wt % to 55 wt %.

This SAW device 100a is separated from the wafer and then resin molded. Here, mold resin is not shown (similarly not shown in the following description). As illustrated in FIG. 18, the planar outline is approximately rectangular. The cover layer 208, which forms the operating space 221, has an end edge retreated inward of the device from an end edge of the piezoelectric plate 201. This retreat of the end edge of the cover layer 208 of the piezoelectric plate 201 exposes the top surface on which a metal electrode layer 206 is disposed. The metal electrode layer 206 electrically connects to the input/output electrode/wiring portion 202b of the IDT 202. The rewiring layer 220 (four pieces of 220a, 220b, 220c, and 220d in this embodiment) is disposed from the surface (the top surface of the device, specifically on the metal electrode layer 206) of the piezoelectric plate 201 to the top surface of the cover layer 208. On the top surface of the device, another electrode or similar member is not disposed. This top surface is a comparatively flat surface, which allows formation of the rewiring layer 220 with a sufficient size and any shape. Accordingly, as described below, when mounting this device on another substrate or combining this device with another device to form the composite device, the conductive connection member such as the solder ball and the solder bump formed on the rewiring layer 220 for mounting or integration ensures a large freedom of choice in position of the formation.

The metal electrode layer 206 and the rewiring layer 220 are formed of a thin film made of Al, Pt, Au, Cu, W, Mo, Ti, or similar material. The film thickness is about 0.1 μm to 0.5 μm.

Fifth Embodiment

Figure 20:
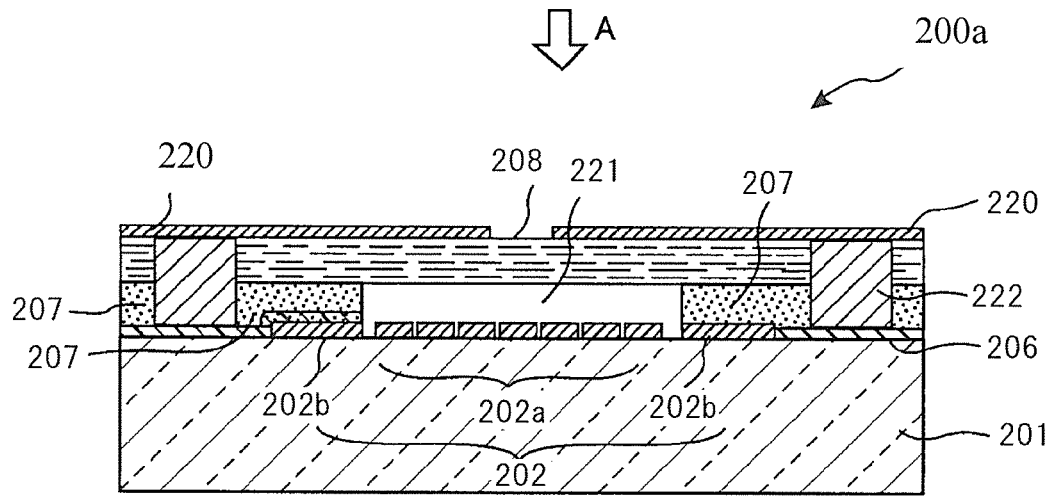
FIG. 20 is a schematic cross-sectional view illustrating a SAW device according to a fifth embodiment of the disclosure.
Figure 21:
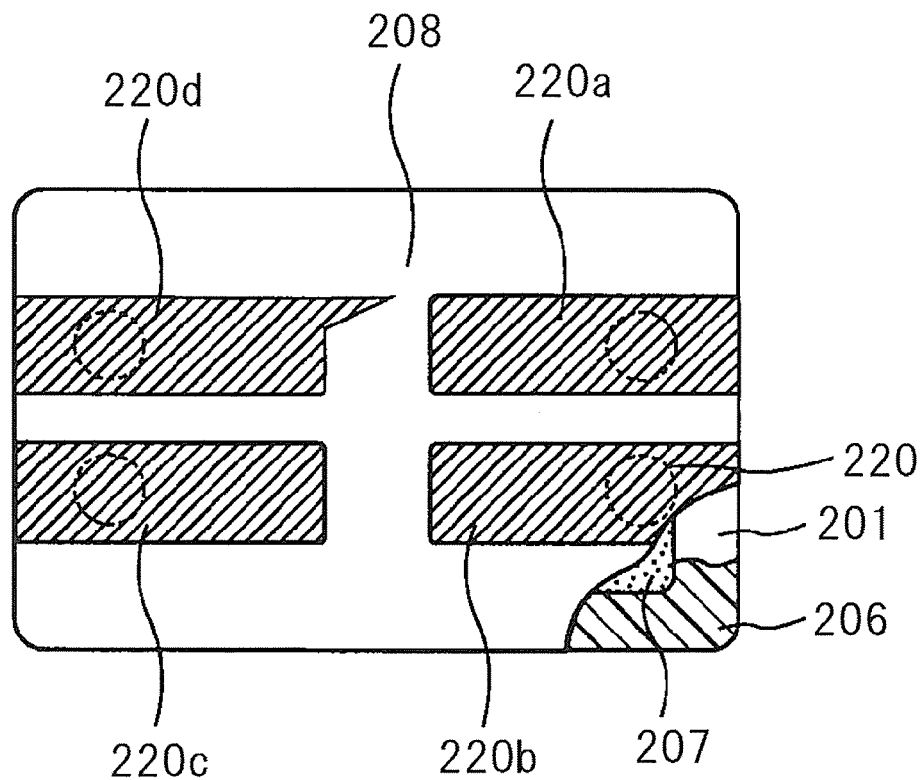
FIG. 21 is a plan view of the SAW device in FIG. 20 viewed from the arrow "A" direction.

FIG. 20 is a schematic cross-sectional view illustrating a SAW device according to a fifth embodiment of the disclosure. FIG. 21 is a plan view of the SAW device in FIG. 20 viewed from the arrow "A" direction. The planar contour of the SAW device viewed from above is approximately rectangular similar to the fourth embodiment except that the level difference due to the cover layer 208 is absent. A description will be mainly given of the difference configuration from the SAW device according to the fourth embodiment. Also in this embodiment, the mold resin is not shown.

In the SAW device 200a of the fifth embodiment, similarly to the fourth embodiment, the rib 207 is disposed on the input/output electrode/wiring portion 202b and on the metal electrode layer 206, surrounding the comb-shaped electrode 202a of the IDT 202. On this rib 207, the cover layer 208 is formed on the whole region of an outer periphery of the principal surface of the piezoelectric plate 201 by tenting. Then, the electrode column 222 is formed passing through the metal electrode layer 206 and the cover layer 208. This electrode column 222 connects to the metal electrode layer 206 and extends upward, and the top end surface of the electrode column 222 is exposed at the top surface of the cover layer 208. The rewiring layer 220 is formed on the cover layer 208 in the shape and in the position as illustrated in FIG. 21 by deposition of aluminum film and by patterning using the photolitho or similar method.

The electrode column 222 of this embodiment is formed by electric field plating using Cu. On the end surface of this electrode column 222, an electroless plating of Ni and Au is performed (not shown). Performing this electroless plating using Ni and Au prevents oxidation of the electrode column 222 of Cu and ensures excellent soldering performance for mounting. Instead of the electroless plating using Ni and Au, an electroless plating using Au only; or Ni, Pd, and Au may be employed.

The SAW device 200a according to the fifth embodiment also has a top surface without any other electrode. Since this surface is a comparatively flat surface, the rewiring layer 220 is formed to have sufficient large area and any shape. Accordingly, as described below, in the case where this device is mounted on another substrate or integrated in another device to make a composite device, a large freedom of choice in forming position is ensured for the conductive connection member such as the solder ball or the solder bump to be formed on the rewiring layer 220 for mounting or integration.

Figure 22:
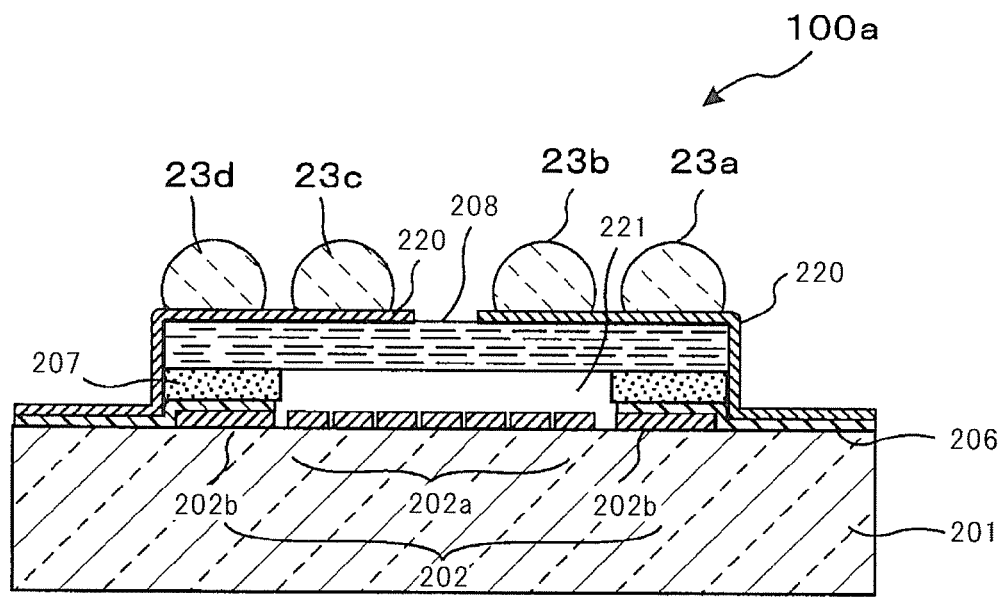
FIG. 22 is a cross-sectional view of an exemplary layout of a conductive connection member for mounting the SAW device according to the disclosure on a mounting board or a conductive connection member for combining the SAW device with another device.

FIG. 22 is a cross-sectional view of an exemplary layout of a conductive connection member for mounting the SAW device according to the disclosure on the mounting board, or a conductive connection member for combining the SAW device with another device. Here, a description will be given of the SAW device 100a according to the fourth embodiment described with FIG. 17A and FIG. 17B in an example using the solder ball 23 as the conductive connection member for mounting on the mounting board. Since the rewiring layer 220 widely expands on the surface of the cover layer 208, the solder ball 23 can be disposed at a position corresponding to a position of a wiring board to be mounted or a terminal electrode/connection pad of a device. FIG. 22 illustrates a state where the four solder balls 23a, 23b, 23c, and 23d are disposed corresponding to positions of terminal pads of a mounting board and unarrayed on the top surface of the device. It is obvious that, depending on an array of terminal pads of a mounting board or similar member, the four solder balls 23a, 23b, 23c, and 23d may be arranged on two mutually perpendicular directions.

Figure 23:
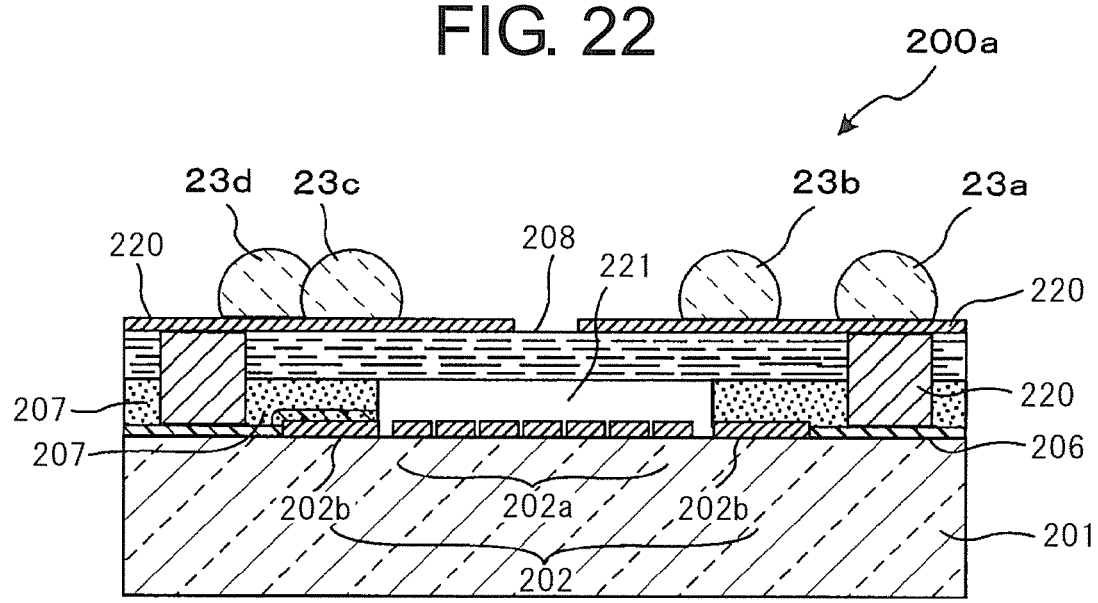
FIG. 23 is a cross-sectional view of an exemplary layout of a conductive connection member for mounting the SAW device according to the disclosure on a mounting board or a conductive connection member for combining the SAW device with another device.

FIG. 23 is a cross-sectional view of an exemplary layout of a conductive connection member for mounting the SAW device according to the disclosure on a mounting board or a conductive connection member for combining the SAW device with another device. Here, a description will be given of the SAW device 200a according to the fifth embodiment described with FIG. 20 in an example using the solder ball as the conductive connection member for mounting on the mounting board. Similarly to the fourth embodiment, since the rewiring layer 220 widely expands on the surface of the cover layer 208, the solder ball 23 can be disposed at a position corresponding to a position of a wiring board to be mounted or a terminal electrode/connection pad of a device. FIG. 23 illustrates a state where the four solder balls 23a, 23b, 23c, and 23d are disposed corresponding to positions of terminal pads of a mounting board and unarrayed. It is obvious that, depending on an array of terminal pads of a mounting board or similar member, the four solder balls 23a, 23b, 23c, and 23d may be arranged on two mutually perpendicular directions.

Figure 24:
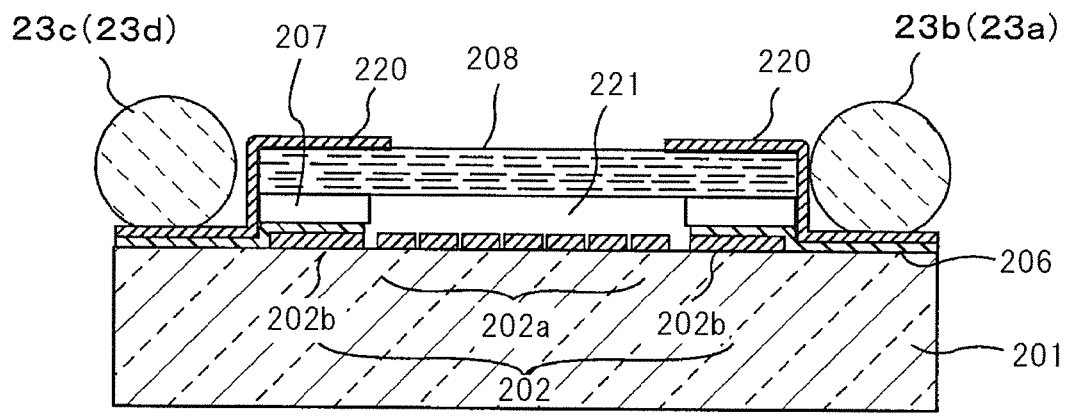
FIG. 24 is a cross-sectional view of an exemplary layout of a conductive connection member for mounting the SAW device according to the disclosure on a mounting board or a conductive connection member for combining the SAW device with another device.

FIG. 24 is a cross-sectional view of an exemplary layout of a conductive connection member for mounting the SAW device according to the disclosure on a mounting board or a conductive connection member for combining the SAW device with another device. Here, a description will be given of the SAW device 100a according to the fourth embodiment described with FIG. 17A and FIG. 17B in an example using the solder ball as the conductive connection member for mounting on the mounting board. This exemplary implementation shows that even the SAW device according to the disclosure can be mounted similarly to a conventional device. This shows the case where the solder balls 23 (23a, 23b, 23c, and 23d) are disposed at the four corners of the top surface of the device, which are fixed positions similarly to a conventional device.

Figure 25:
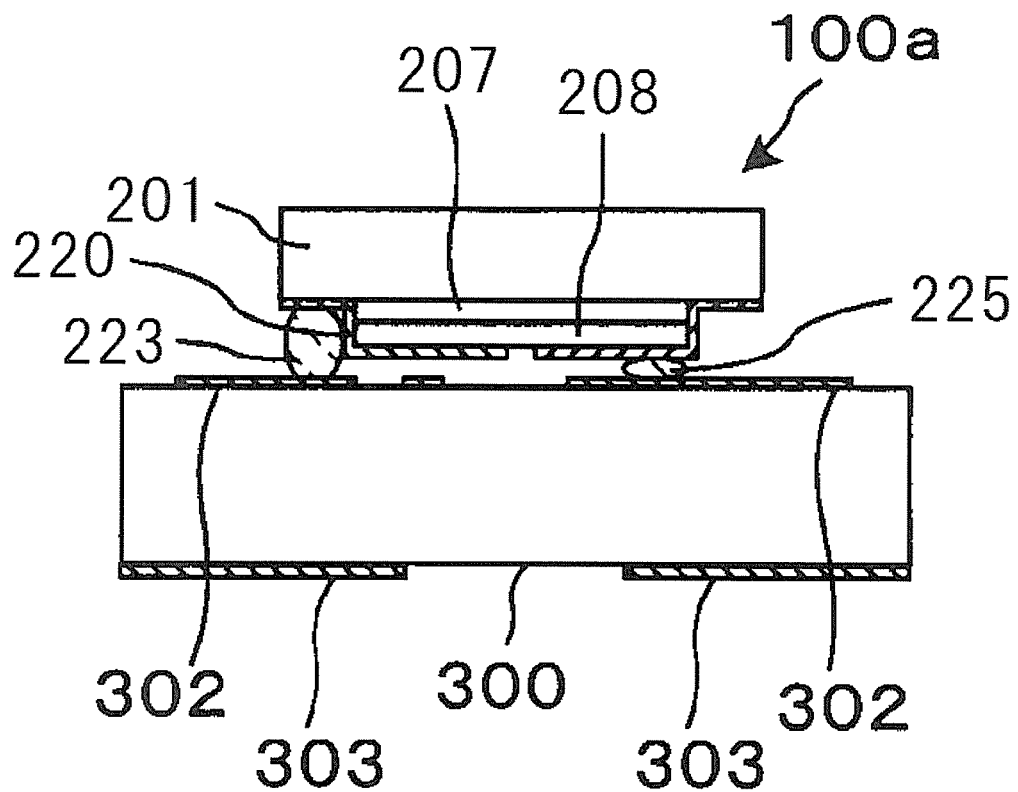
FIG. 25 is a schematic cross-sectional view illustrating an exemplary composite component where the SAW device according to the disclosure and another device are integrated.

FIG. 25 is a schematic cross-sectional view illustrating an exemplary composite component where the SAW device according to the disclosure and another device are integrated. Here, a description will be given of the case where the SAW device 100a according to the fourth embodiment described with FIG. 17A and FIG. 17B is integrated in another component 300. The other component 300 is a discrete component, which is a piezoelectric component or another kind of component and can be combined. On one surface (the top surface in FIG. 25) of the other component 300, terminal pads 302, which does not take an arrangement of the external terminals of the SAW device 100a into account, are disposed. On the other surface (the bottom surface in FIG. 25) of the other component 300, mounting terminals 303 to be connected to mounting terminals (or pad) of a mounting board (not shown) are disposed.

In the case where the SAW device 100a is combined with the other component 300 thus configured, the solder ball 23 or the bump (the solder bump etc.) 225 are positioned at the position facing the terminal pad 302 of the other component 300 on the rewiring layer 220 of the SAW device 100a, and both are temporarily secured. Reflow process in this state integrally bonds both sides to make a combined component. Thus, the SAW device 100a according to the disclosure can be connected to the other component 300 at any position corresponding to an arrangement of the terminal pads 302 of the other component 300 to be combined.

Figure 26:
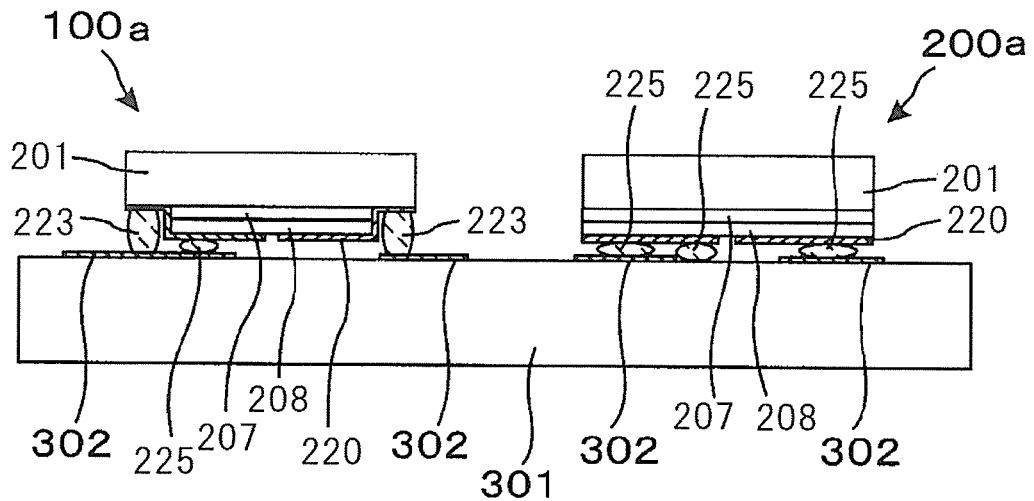
FIG. 26 is a schematic cross-sectional view illustrating an example of mounting the SAW device according to the disclosure and another device on a circuit board of applicable equipment together.
Figure 27:
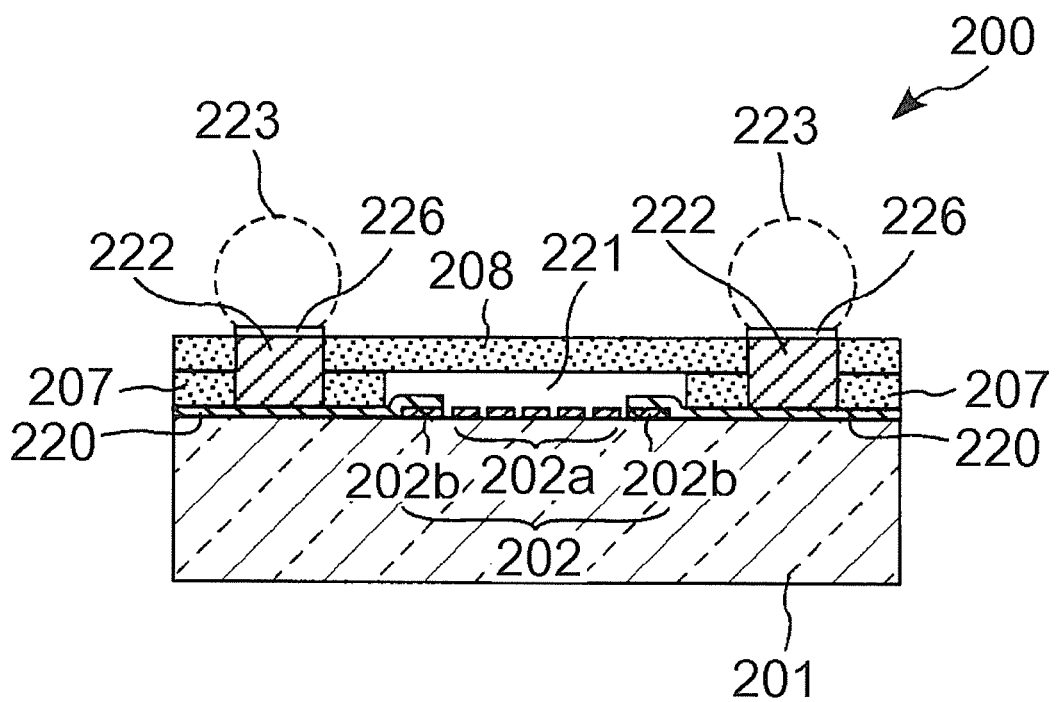
FIG. 27 is a schematic cross-sectional view illustrating a simplified example of a conventional SAW device where an operating space is formed with a cover layer of resin material.

FIG. 26 is a schematic cross-sectional view illustrating an example of mounting the SAW device according to the disclosure and another device on a circuit board of applicable equipment together. Here, a description will be given of an example of mounting the SAW device 100a according to the disclosure described with FIG. 17A and FIG. 17B and the SAW device 200a according to the disclosure described with FIG. 20 on a circuit board 301 of applicable equipment. On one surface (the top surface in FIG. 26) of the circuit board 301, a plurality of terminal pads 302 are formed along with a wiring pattern. Besides, on the circuit board 301, another component (not shown) is mounted.

The terminal pads 302 of the circuit board 301 do not take an arrangement of external terminals of the SAW devices 100a and 200a according to the disclosure into consideration. On the circuit board 301 thus configured, the SAW devices 100a and 200a are connected such that the solder balls 23 or the solder bumps 225 are disposed at the appropriate position facing the terminal pads 302 between the rewiring layer 220 and the terminal pads 302 on the circuit board 301. This increases freedom of choice in circuit design at a customer side who fabricates applicable equipment, thus ensuring effective circuit design.

This disclosure discloses a piezoelectric component that includes: a piezoelectric plate; a comb-shaped electrode and an input/output electrode/wiring portion formed on a principal surface of the piezoelectric plate; a rib of resin material disposed on a peripheral area of an IDT; and a cover layer of resin material disposed on the rib to form an operating space of the IDT. The resin that constitutes the cover layer is a photosensitive thermosetting resin where fine-grained white mica piece is contained as filler in this photosensitive thermosetting resin. A plurality of rewiring layers, which electrically connect to the input/output electrode/wiring portion of the IDT, are disposed on the cover layer. The rewiring layers each allow installation of an any external terminal at any position on the rewiring layer corresponding to a position of a terminal pad of equipment for mounting.

In the disclosure, the photosensitive thermosetting resin constituting the cover layer is a photosensitive thermosetting resin that is preferably a polyimide resin, which emits little gas. This photosensitive thermosetting resin contains 40 weight % to 60 weight % of the fine-grained white mica pieces.

The cover layer has an end edge at a position retreated from an end edge of the piezoelectric plate. The piezoelectric plate includes a metal electrode layer on a top surface exposed due to the retreated end edge of the cover layer. The metal electrode layer connecting to the rewiring layer is electrically connected to the input/output electrode/wiring portion of the IDT. The rewiring layer extends on the cover layer and is electrically connected.

The piezoelectric component includes a metal electrode layer on the input/output electrode of the IDT. The metal electrode layer extends at an outer periphery of a principal surface of the piezoelectric plate. The rewiring layer electrically connects to the metal electrode layer via an electrode column passing through the rib and the cover layer.

The cover layer does not include a construction that restricts formation of an electrode on the top surface, thus allowing formation the rewiring layer in any shape and size. In view of this, this allows disposing an electrically connecting member for mounting such as a solder ball and a solder bump at any position corresponding to, for example, a terminal pad on a mounting board of electronic equipment of a customer or similar part. This gives improvement of freedom in design of the mounting terminal at a customer side.

The photosensitive thermosetting resin of the cover layer that forms the operating space of the IDT contains fine-grained white mica pieces with translucency in a range of 40 weight % to 60 weight %. This ensures an effective hardening process by light effect process of resin and a dramatically improved elastic modulus, and reduces damage of the operating space of the IDT due to heating and pressurization in a molding process of the component or a similar process.

The piezoelectric component according to this disclosure is available for a piezoelectric element and a component that require extremely high impact resistance property and high reliability such as SAW device, piezoelectric thin film filter, Film Bulk Acoustic Resonator (FBAR), Micro Electro Mechanical Systems (MEMS), and its fabrication. This is also applicable for what is called "filter bank", a multiple filter module, and similar part and applicable for single component with a plurality of piezoelectric elements with mutually different properties.

The principles, preferred embodiment and mode of operation of the present disclosure have been described in the foregoing specification. However, the disclosure which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present disclosure. Accordingly, it is expressly intended that all such variations, changes and equivalents which fall within the spirit and scope of the present disclosure as defined in the claims, be embraced thereby.

What is claimed is:
1. A piezoelectric component, comprising:
   a piezoelectric element that includes: a piezoelectric plate; a comb-shaped electrode and an input/output electrode on a principal surface of the piezoelectric plate; a cover layer disposed above the comb-shaped electrode; and a rib to form a void between the comb-shaped electrode and the cover layer, wherein the cover layer includes a photosensitive thermosetting resin in which translucent filler is contained, wherein the piezoelectric element further includes:

an Under Bump Metal film, disposed at the piezoelectric plate side of the rib; and a metal thin film, covering the cover layer and hermetically sealing the void, wherein the piezoelectric component further includes:

an electrode terminal, integrally bonded on the piezoelectric element, the electrode terminal electrically connecting to the input/output electrode of the piezoelectric element; and a wiring board with a mounting terminal for external equipment, wherein at least the piezoelectric plate and the wiring board are resin sealed.

2. The piezoelectric component according to claim 1, wherein the translucent filler includes: fine-grained white mica pieces, and the fine-grained white mica pieces are contained in a base resin of a resin film in a range of 45 to 55 weight percent.

3. The piezoelectric component according to claim 1, wherein the input/output electrode of the piezoelectric element and an electrode terminal of the wiring board are electrically connected via a conductive connection member, and the conductive connection member is disposed at an outer end portion of the cover layer.

4. The piezoelectric component according to claim 3, wherein the conductive connection member that electrically connects the input/output electrode and the wiring board is a solder ball.

5. The piezoelectric component according to claim 3, wherein the conductive connection member that electrically connects the input/output electrode and the wiring board is a copper ball.

6. The piezoelectric component according to claim 1, wherein the input/output electrode of the piezoelectric element and an electrode terminal of the wiring board are electrically connected by a wire.

7. The piezoelectric component according to claim 1, wherein a plurality of the piezoelectric elements are mounted on one device.

8. A piezoelectric component, comprising:

a piezoelectric element that includes: a piezoelectric plate; a comb-shaped electrode and an input/output electrode on a principal surface of the piezoelectric plate; a cover layer disposed above the comb-shaped electrode; and a rib to form a void between the comb-shaped electrode and the cover layer, wherein the cover layer includes a photosensitive thermosetting resin in which translucent filler is contained, wherein the comb-shaped electrode and the input/output electrode constitute an interdigital transducer, the rib is made of a resin material and disposed at a peripheral area of the interdigital transducer, the void is an operating space for the interdigital transducer, the translucent filler includes: fine-grained white mica pieces, the piezoelectric component further includes: a plurality of rewiring layers on the cover layer, the plurality of rewiring layers being electrically connected to the input/output electrode of the interdigital transducer, and the rewiring layers are each configured to allow an external terminal to be disposed on any position of the rewiring layers.

9. The piezoelectric component according to claim 8, wherein the photosensitive thermosetting resin constituting the cover layer includes:

a resin material to which a photosensitizing agent, a hardening agent, and 40 weight % to 60 weight % of the fine-grained white mica pieces are added.

10. The piezoelectric component according to claim 8, wherein the cover layer has an end edge at a position retreated from an end edge of the piezoelectric plate, the piezoelectric plate includes: a metal electrode layer on a top surface exposed due to the retreated end edge of the cover layer, the metal electrode layer is connected to the rewiring layer, and the rewiring layer is electrically connected to the input/output electrode of the interdigital transducer, and the rewiring layer extends on the cover layer and electrically connected.

11. The piezoelectric component according to claim 9, wherein the cover layer has an end edge at a position retreated from an end edge of the piezoelectric plate, the piezoelectric plate includes: a metal electrode layer on a top surface exposed due to the retreated end edge of the cover layer, the metal electrode layer is connected to the rewiring layer, and the rewiring layer is electrically connected to the input/output electrode of the interdigital transducer, and the rewiring layer extends on the cover layer and electrically connected.

12. The piezoelectric component according to claim 8, further comprising:

a metal electrode layer on the input/output electrode of the interdigital transducer, the metal electrode layer extending at an outer periphery of the principal surface of the piezoelectric plate, wherein the rewiring layer electrically connects to the metal electrode layer via an electrode column passing through the rib and the cover layer.

* * * * *